(12) United States Patent
Nagata et al.

(10) Patent No.: US 8,144,045 B2
(45) Date of Patent: Mar. 27, 2012

(54) TIMING SIGNAL GENERATOR CIRCUIT FOR USE IN SIGNAL WAVEFORM MEASUREMENT SYSTEM FOR MEASURING MULTI-CHANNEL ON-CHIP SIGNALS FLOWING ON VLSI

(75) Inventors: Makoto Nagata, Kobe (JP); Takushi Hashida, Kobe (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 88 days.

(21) Appl. No.: 12/828,641

(22) Filed: Jul. 1, 2010

(65) Prior Publication Data

US 2012/0001785 A1    Jan. 5, 2012

(30) Foreign Application Priority Data

Jul. 1, 2009    (JP) .................................. 2009-156755

(51) Int. Cl.
*H03M 1/82*    (2006.01)
(52) U.S. Cl. ........................................ 341/152; 341/144
(58) Field of Classification Search .................. 341/144, 341/152, 134, 135, 136
See application file for complete search history.

(56) References Cited

U.S. PATENT DOCUMENTS

| | | | | |
|---|---|---|---|---|
| 4,947,171 A | * | 8/1990 | Pfeifer et al. .................. | 341/143 |
| 5,138,204 A | | 8/1992 | Imamura et al. | |
| 6,052,076 A | * | 4/2000 | Patton et al. ................... | 341/144 |
| 6,922,066 B2 | | 7/2005 | Hidaka | |
| 7,332,916 B2 | | 2/2008 | Nagata | |
| 7,345,609 B2 | * | 3/2008 | Briaire .......................... | 341/144 |
| 7,609,100 B2 | | 10/2009 | Nagata | |

FOREIGN PATENT DOCUMENTS

| | | |
|---|---|---|
| JP | 5-75410 | 3/1993 |
| JP | 10-123215 | 5/1998 |
| JP | 2001-77160 | 3/2001 |
| JP | 2003-28898 | 1/2003 |
| JP | 2006-276010 | 10/2006 |
| JP | 4150402 | 7/2008 |

OTHER PUBLICATIONS

Nagata, M. et al., "Effects of Power-Supply Parasitic Components on Substrate Noise Generation in Large-Scale Digital Circuits", 2001 Symposium on VLSI Circuits Digest of Technical Papers, #15-1, (Jun. 2001), pp. 159-162.

(Continued)

*Primary Examiner* — Peguy Jean Pierre
(74) *Attorney, Agent, or Firm* — Nixon & Vanderhye P.C.

(57) ABSTRACT

A timing signal generator circuit includes a DA converter converting an input digital value into an analog voltage, and a VT converter converting the analog voltage into a corresponding delay time. The DA converter includes a current source circuit, which supplies a current (n×Is) ("n" is a number corresponding to the input digital value) selected from a total supply current (N×Is) as a current Iout to the resistors, and supplies the remaining current (N−n)×Is as a current Idump to the resistors, outputs a voltage across the resistors as an analog voltage Vdac, and outputs a voltage across the resistor as a reset voltage Vreset. The VT converter charges the integration capacitor with a constant current from the constant current source by using the reset voltage as an initial voltage, and outputs a timing signal when the integral voltage exceeds the analog voltage.

20 Claims, 14 Drawing Sheets

OTHER PUBLICATIONS

Noguchi, K. et al., "On-chip Power/Ground Measurement Technique", the 7th system LSI workshop proceedings, (Nov. 2003), pp. 287-290, together with a partial English translation.

Straayer, M.Z., et al, "An efficient high-resolution 11-bit noise-shaping multipath gated ring oscillator TDC", 2008 IEEE Symposium on VLSI Circuits, pp. 82-83, Jun. 18-20, 2008.

* cited by examiner

Fig.3 ON-CHIP SIGNAL WAVEFORM MONITOR APPARATUS 100

21a

22a

TIMING SIGNAL GENERATOR CIRCUIT FOR USE IN SIGNAL WAVEFORM MEASUREMENT SYSTEM FOR MEASURING MULTI-CHANNEL ON-CHIP SIGNALS FLOWING ON VLSI

BACKGROUND OF THE INVENTION

1. Field of the Invention

The present invention relates to a timing signal generator circuit for use in a signal waveform measurement system for measuring multi-channel on-chip signal waveforms on fixed voltage interconnection lines of, for example, an internal signal, a power voltage, a ground voltage, a well voltage, a substrate voltage and so on of a semiconductor very large scale integrated circuit (hereinafter referred to as a VLSI).

2. Description of the Related Art

Circuits to be mounted on chips are increased in scale in accordance with scale shrinkage of semiconductor manufacturing processes, and lately a mixed signal system LSI in which different kinds of signal processing functions, such as analog and digital or high-frequency wireless communication processing and baseband data processing, are integrated together on a single chip is general. However, in such an LSI having a configuration in which a number of function circuits are interconnected inside a chip, the operating states of the function circuits cannot therefore be observed from outside the chip, and this has made it difficult to analyze failures at the time of malfunctioning. On the other hand, it becomes more important to consider noises generated in the power/ground/well/substrate in the high-speed low-power consumption LSIs, and there is a growing demand for measuring and evaluating noises inside the chips in an on-chip manner. Their background arts are disclosed in the Patent Documents 1 to 3.

It is effective for these demands to mount a function to measure the internal signals in LSI chips. Conventionally, it is disclosed that the noise distribution in a chip can be measured by making an array of a detection front-end (FE) circuit configured by including a source follower (SF) circuit and a latch comparator (LC) (refer to the Non-Patent Document 1). However, there has been a problem of high cost since the number of output pins necessary for measurement is great and the required performance of an external measuring instrument is expensive in accordance with the on-chip configuration of only the detection front-end circuit. As a solution measure for the problem, an on-chip configuration of a timing signal generator circuit and a reference voltage generating mechanism in addition to the detection front-end circuit is also proposed (refer to the Non-Patent Document 2). However, a measuring time reduction, a chip area reduction and securing of a measurement accuracy in a multi-channel configuration remain as problems, and it has been insufficient as means for measuring in an on-chip multi-channel manner various waveforms such as noises of internal signals, ground voltages, well voltages, substrate voltages and so on of very large scale integrated circuits.

FIG. 13 is a block diagram showing a configuration of a timing signal generator circuit according to the first prior art. The timing signal generator circuit is configured by connecting in cascade a plurality of delay inverters 101 to 104 and includes a multiplexer 105 to selectively output an output signal of any one of the output signals of inverters 101 to 104. The timing signal generator circuit, which has such an advantageous effect that a delay step can be discretized by the inverter delay time, has however been unable to avoid an increase in the circuit scale (consumption current) due to an increase in resolution (multi-bit configuration) and has had a problem of large operating noises because all the inverters necessarily operate in selecting whichever delay.

Moreover, in order to solve the problems of the Patent Documents 1 to 3, the present inventor and others propose a sampling timing signal generator circuit for the signal waveform measurement system, the sampling timing signal generator circuit being suitable for an on-chip signal waveform measurement apparatus of which the operating noise is small in comparison with the prior arts in the Patent Documents 4 to 6. The sampling timing signal generator circuit is a sampling timing signal generator circuit that generates a plurality of enable timing signals on the basis of a predetermined system clock signal and a predetermined master clock signal, and the sampling timing signal generator circuit includes a replica DLL (Delayed Locked Loop) circuit that generates a predetermined reference bias voltage in synchronization with the system clock signal on the basis of the system clock signal and outputs the same, and a delay signal generator circuit that generates a current by dividing a reference current corresponding to the reference bias voltage by 1/n (where "n" is an integer not smaller than one) on the basis of the master clock signal and the reference bias voltage, generates a predetermined time delay by multiplying a time interval for charging an output load capacitance by "n" times on the basis of the generated current and generates an enable timing control signal by multiplexing the plurality of enable timing signals by delaying the master clock signal by the delay time. By generating the reference bias voltage by the replica DLL circuit so that the delay time becomes equal to the period of the system clock signal, the delay signal generator circuit is characterized by generating the enable timing signals.

FIG. 14 is a circuit diagram showing a configuration of the sampling timing signal generator circuit according to the second prior art proposed in the Patent Documents 4 to 6. The sampling timing signal generator circuit generates a delay time by generating a current weighted 1/n-fold in a current source 107 controlled by a bias voltage Vbs generated by a bias voltage generator 106, integrating the generated current by a single capacitor 109 via an inverter 108 of a CMOS circuit configured by including MOS field-effect transistors (hereinafter referred to as MOSFETs) Q1 and Q2 and inputting its output voltage as an input voltage Vint to an inverter 110 that operates as a comparator.

Prior Art Documents related to the present invention are as follows:

Patent Document 1: Japanese patent laid-open publication No. JP 10-123215 A;
Patent Document 2: Japanese patent laid-open publication No. JP 2001-077160 A;
Patent Document 3: Japanese patent laid-open publication No. JP 2003-028898 A;
Patent Document 4: Japanese patent No. JP 4150402;
Patent Document 5: U.S. Pat. No. 7,332,916;
Patent Document 6: Japanese patent laid-open publication No. JP 2006-276010 A;
Patent Document 7: Japanese patent laid-open publication No. JP H05-075410 A;
Non-Patent Document 1: Makoto Nagata et al., "Effects of Power-Supply Parasitic Components on Substrate Noise Generation in Large-Scale Digital Circuits", 2001 Symposium on VLSI Circuits Digest of Technical Papers, #15-1, Kyoto in Japan, pp. 159-162, June 2001;
Non-Patent Document 2: Kouichirou Noguchi et al., "On-chip Power/Ground Measurement Technique", the 7th system LSI workshop proceedings, hosted by The IEICE Electronics Society Technical Committee on Integrated Circuits and Devices, pp. 287-290, November, 2003; and Non-Patent Document 3: M. Z. Straayer et al., "An efficient high-resolution 11-bit noise-shaping multipath gated ring oscillator TDC", 2008 IEEE Symposium on VLSI Circuits, pp. 82-83, Jun. 18-20, 2008.

FIG. 15 is a graph showing a delay time characteristic of the bias voltage Vbs of the sampling timing signal generator circuit of FIG. 14 of the second prior art, and FIG. 16 is a graph showing a delay time characteristic of an input voltage Vint to the comparator (configured by including the inverter 110) of the sampling timing signal generator circuit of FIG. 14. In the timing signal generator circuit of the second prior art, in which only a single circuit operates for the generation of the delay time, therefore has such an advantageous effect that the noise is small. However, there have been such problems that a nonlinear bias voltage as shown in FIG. 15 is necessary for the 1/n-fold current value weighting, and a difference of the bias voltage becomes small in a high-resolution (multi-bit) configuration, resulting in deteriorating the linearity and controllability. There has been such a further problem that the input voltage slope of the comparator depends on the code, and nonlinearity occurs in the response of the comparator as shown in FIG. 16.

FIG. 17 is a circuit diagram showing a configuration of a timing generator circuit according to the third prior art disclosed in the Patent Document 7. The timing generator circuit is configured by including an input terminal 201, a buffer amplifier 202, a switch 203, a constant current source 204, a DA converter 209, a mirror amplifier 210 having a mirror capacitance $C_0$, a comparator 207, and an output terminal 208. In the timing generator circuit, the mirror capacitance $C_0$ is discharged by a constant current in a saturation region and a linear region, and a delay time is generated by comparing the inverted input terminal of the mirror amplifier 210 with a constant value $V_{TH}$. Since the delay time generated in the linear region in which the slope of the ramp waveform is small can be accurately changed by input data, the delay time can be set to a high accuracy and a high resolution. Moreover, by virtue of the comparison with the constant value in the saturation region in which the slope of the ramp waveform is large, a noise resistance can be achieved even when the delay time is long. That is, by changing the equivalent capacity of the mirror amplifier 210, a programmable delay line, of which the configuration is simple, the linearity is good, and high-speed operation is possible, is achieved. However, there has been such a problem that the accuracy of conversion to the delay time is largely degraded since the discharging characteristic becomes nonlinear in the saturation region when the mirror capacitance $C_0$ is discharged by a constant current in the saturation region and the linear region.

The aforementioned various problems of the prior arts are as follows if digested.

In order to actualize an on-chip signal monitor apparatus (refer to, for example, the Non-Patent Documents 4 to 6) for testing the functions of VLSIs or observing the internal states of VLSIs, a high-resolution timing signal generating function on the picosecond order is indispensable. A high-linearity multi-bit digital delay time generating function is required for the reference clock signal.

Regarding the timing generating methods of the prior arts, there is reported a delay chain method by a multistage connection of delay generator circuits in a manner similar to that of the first prior art, a circuit to generate a time interval when an integral voltage reaches a fixed voltage by bias current integration on a single capacitance in a manner similar to that of the second prior art and so on. However, the first prior art, which can generate a delay time with a subpicosecond resolution by, for example, the multistage connection of current control type inverters and an interpolation circuit, however needs an inverter on the $2^n$ order for generating an n-bit delay step, and therefore, the circuit scale is increased. Further, since the multistage connection structure indispensably needs to operate all the stages, increases in the power and noise cannot be avoided. On the other hand, the second prior art, which can generate a multibit delay time with a single current source and a single capacitance, is therefore able to suppress the increase in the circuit scale and the generation of noises. However, since it is necessary for the variability of the delay time to control the integral current amount, and the current amount of the MOS circuit is nonlinear to the control voltage, voltage controllability deteriorates in the multistage configuration, and maintenance of the linearity becomes difficult. In particular, in the third prior art, at the time of discharging the mirror capacitance $C_0$ by a constant current in the saturation region and the linear region, the discharge characteristic becomes nonlinear, in particular, in the saturation region, and therefore, the accuracy of conversion to the delay time is largely degraded.

SUMMARY OF THE INVENTION

It is a first object of the invention is to solve the aforementioned problems and provide a timing signal generator circuit, which has higher accuracy and higher resolution than those of the prior arts, and in particular, has a higher resolution not smaller than picosecond or subpicosecond order.

It is a second object of the invention to solve the aforementioned problems and provide a timing signal generator circuit, which is able to reduce a portion in which the characteristic of conversion to the delay time is nonlinear and has higher accuracy and higher resolution than those of the prior arts.

In order to achieve the aforementioned objective, according to one aspect of the present invention, there is provided a timing signal generator circuit for converting an input digital value into a timing signal having a delay time corresponding to the input digital value. The timing signal generator includes a digital-to-analog converter, and an analog voltage-to-time converter. The digital-to-analog converter converts the input digital value into an analog voltage corresponding to the input digital value, and the analog voltage-to-time converter converts the analog voltage into a delay time corresponding to the analog voltage. The digital-to-analog converter includes first and second resistors, and a current source circuit. The first resistor generates a predetermined reset voltage, and the second resistor connected in series to the first resistor, the second resistor generating the analog voltage with the first resistor. The current source circuit supplies an n-fold current (n×Is) (where "n" is a number corresponding to the input digital value) as a first current from among a total supply current (N×Is) to the first and second resistors, and supplies a remaining current (N−n)×Is as a second current to the first resistor. The digital-to-analog converter outputs a reset voltage generated by a sum of a first current flowing through the first resistor and a second current, and outputs an analog voltage of a sum of the reset voltage and a voltage generated by the first current flowing through the second resistor.

The analog voltage-to-time converter includes a comparison voltage charging capacitor, a first constant current source, an integration capacitor, and a comparator. The comparison voltage charging capacitor charges the analog voltage, and the first constant current source supplies a predetermined constant current. The integration capacitor charges the constant current from the first constant current source by using the reset voltage as an initial voltage, and the comparator compares an integral voltage of the integration capacitor with the analog voltage charged in the comparison voltage charging capacitor, and outputting a predetermined timing signal when the integral voltage exceeds the analog voltage.

In the above-mentioned timing signal generator circuit, the digital-to-analog converter further includes a third resistor inserted in series between the first resistor and the second resistor, the third resistor generating a base voltage that is a voltage between the reset voltage and the analog voltage, by a current of a sum of the first current and the second current.

In addition, in the above-mentioned timing signal generator circuit, the current source circuit further includes a first controller including a plurality of N second constant current sources each supplying a predetermined constant current, the first controller controlling the N second constant current sources to supply constant currents from "n" second constant current sources (where "n" corresponding to the input digital value) selected from the plurality of N second constant current sources to a first output terminal, and to supply remaining constant currents from (N−n) second constant current sources to a first connection terminal.

Further, in the above-mentioned timing signal generator circuit, the analog voltage-to-time converter further includes a second controller for charging the integration capacitor with the reset voltage, charging the comparison voltage charging capacitor with the analog voltage, and thereafter, charging the integration capacitor with a constant current from the first constant current source.

Still further, in the above-mentioned timing signal generator circuit, the comparator includes an inverter including an input terminal connected to one end of the comparison voltage charging capacitor, the inverter having a threshold voltage that is a ground voltage. The second controller controls the integration capacitor, the comparison voltage charging capacitor, and the first constant current source to charge the integration capacitor with the reset voltage, to charge the comparison voltage charging capacitor with the analog voltage, to connect another end of the comparison voltage charging capacitor to the ground via the integration capacitor, and thereafter, to charge the integration capacitor with a constant current from the first constant current source.

Still more further, in the above-mentioned timing signal generator circuit, the second controller controls the first constant current source to start up the first constant current source before a timing when the integration capacitor is charged with the constant current from the first constant current source.

Still more further, in the above-mentioned timing signal generator circuit, the integration capacitor is a variable capacitor whose capacitance value can be changed.

Therefore, according to the timing signal generator circuit of the invention, the output voltage from the digital-to-analog converter is converted into the delay amount on the time base by the comparator, and therefore, a multi-bit configuration can be achieved with keeping the circuit current for generating the delay constant. Moreover, since the analog voltage-to-time converter can be configured by including substantially one comparator in a small area, and therefore, a timing signal generator circuit having higher time resolution and higher accuracy than those of the prior arts can be actualized by, for example, the fast switching characteristic of a nanometer device. In particular, in the digital-to-analog converter, the integration is started by the reset voltage, and the voltage search of the analog voltage-to-time conversion is started from the base voltage. Therefore, the portion in which the integral voltage is nonlinear can be eliminated. Moreover, by performing control so that the first constant current source to supply a current for the integration is started up before the timing when the integration capacitor performs the integration, the nonlinear portion at the startup time of the first constant current source can be eliminated. Therefore, a timing signal generator circuit having higher time resolution and higher accuracy than those of the prior arts can be actualized.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
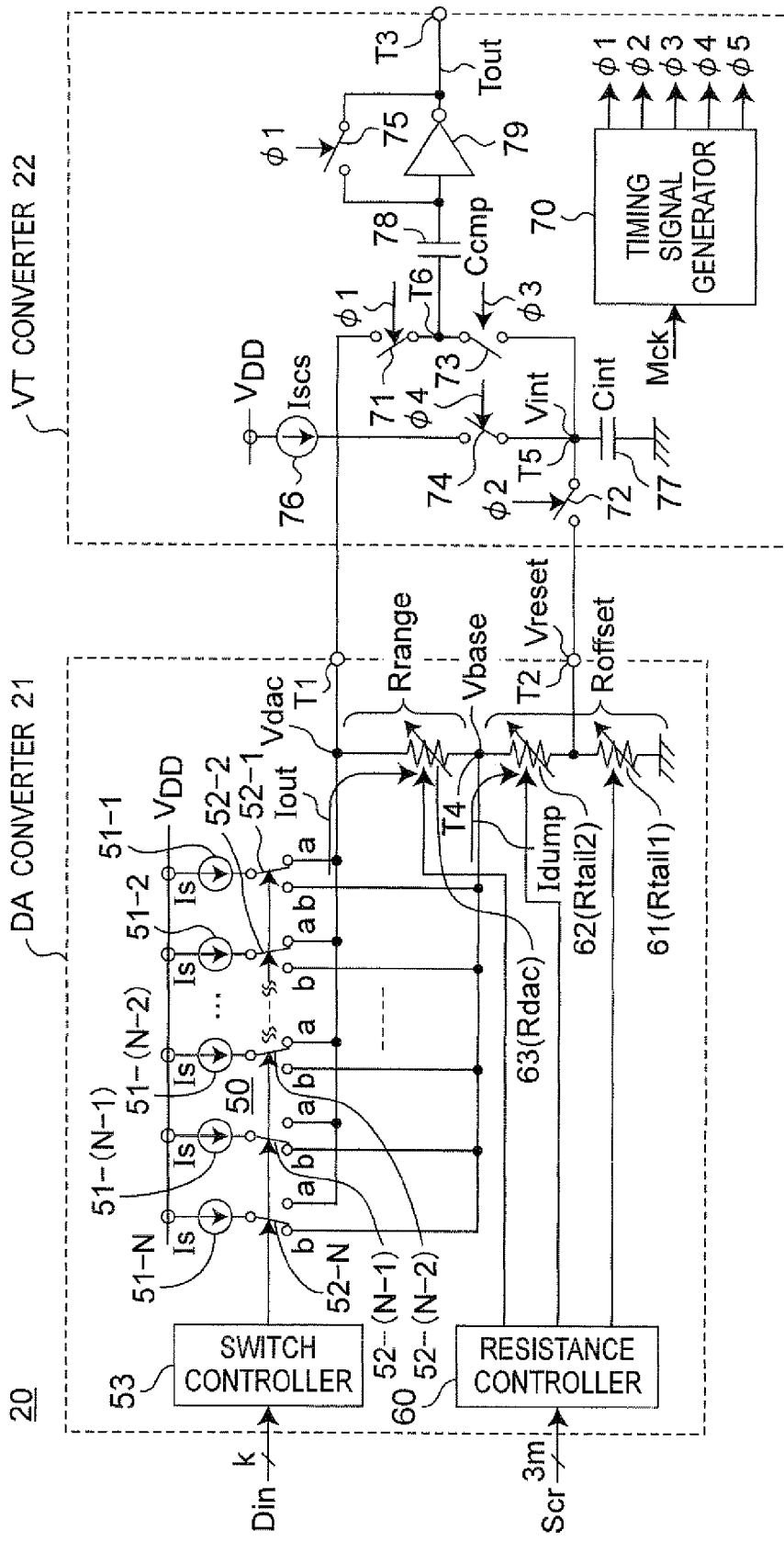
FIG. 1 is a circuit diagram showing a detailed configuration of a sampling timing signal generator circuit 20 according to one preferred embodiment of the invention.

Preferred embodiments of the present invention will be described below with reference to the drawings. In the following preferred embodiments, like components are denoted by like reference numerals.

Preferred Embodiments

Figure 2:
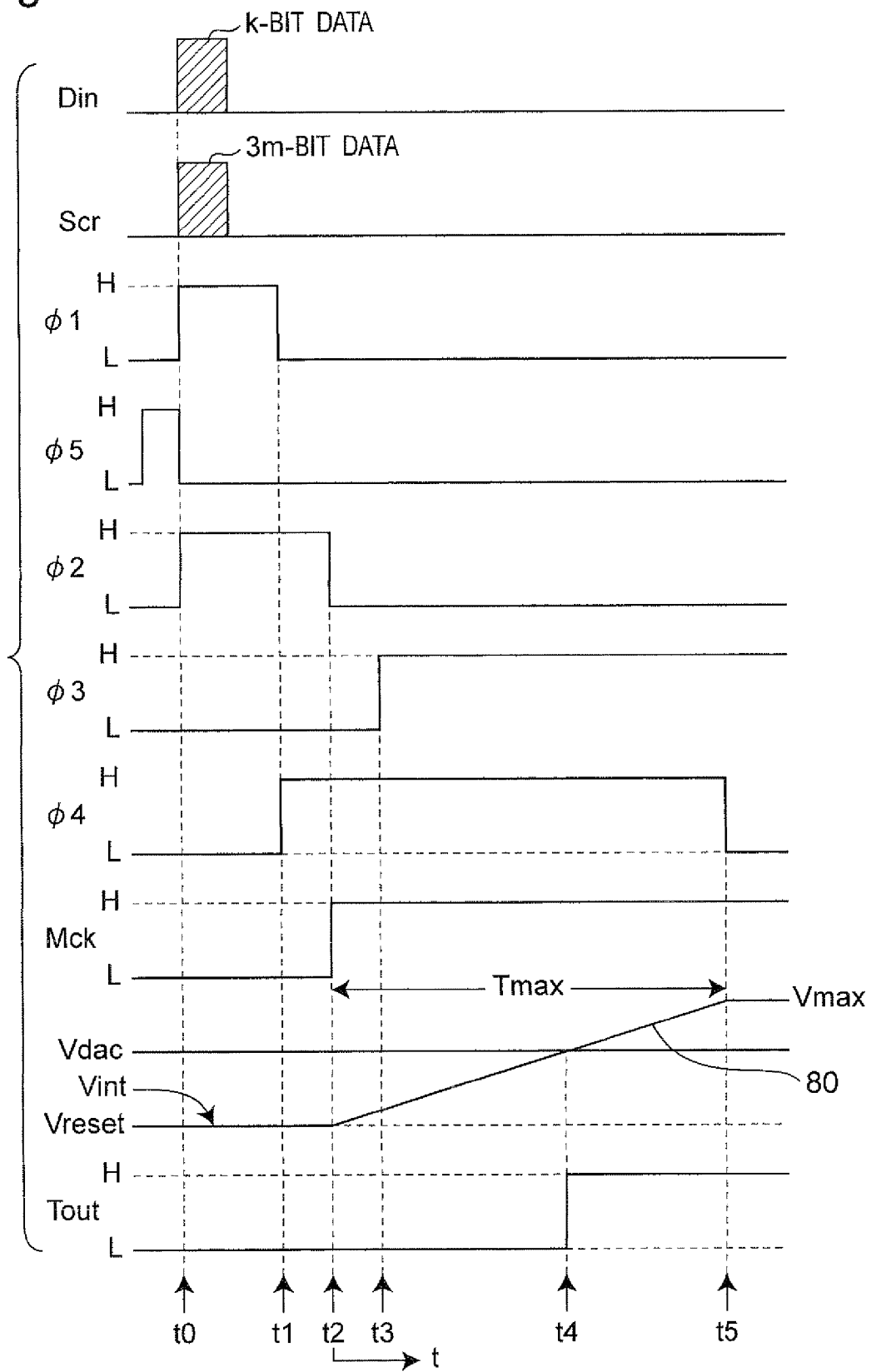
FIG. 2 is a timing chart showing relations between control signals used in the sampling timing signal generator circuit 20 of FIG. 1 and an output signal Tout.

FIG. 1 is a circuit diagram showing a detailed configuration of a sampling timing signal generator circuit 20 according to one preferred embodiment of the invention, and FIG. 2 is a timing chart showing relations between control signals used in the sampling timing signal generator circuit 20 of FIG. 1 and an output signal Tout.

Giving solutions to the aforementioned problems, the preferred embodiment of the invention is a timing signal generator circuit having higher accuracy and higher resolution than those of the prior arts, and in order to particularly provide a timing signal generator circuit 20 having a high resolution not smaller than picosecond or subpicosecond order, it is characterized in that an analog voltage-to-time converter (hereinafter referred to as a VT converter) 22 is configured by comparing an integration ramp voltage 80 of an integral voltage Vint obtained by integrating a bias current Iscs on a unit capacitance of an integration capacitor 77 from a constant current source 76 with an analog voltage Vdac charged from a digital-to-analog voltage converter (hereinafter referred to as a DA converter) 21 into a comparison voltage charging capacitor 78 used as a reference voltage (threshold voltage) by an inverter 79 serving as a comparator. Therefore, the entire sampling timing signal generator circuit 20 of FIG. 1 configures a digital-to-time converter (hereinafter referred to as a DT converter) that converts an input digital value Din into a timing signal Tout (generated by delaying the input digital value Din by a corresponding delay time from the rise timing of a master clock signal Mck) having a delay time corresponding to the input digital value Din.

The configuration of the timing signal generator circuit 20 is first described below with reference to FIG. 1.

Referring to FIG. 1, in order to convert the input digital value Din into an analog voltage Vdac, the DA converter 21 is configured by including a plurality of N ($=2^k$; k is an integer not smaller than one in this case) constant current sources 51-1 to 51-N, which are connected to a power voltage $V_{DD}$ and supply respective predetermined constant currents Is, and N switches 52-1 to 52-N connected to the constant current sources 51-1 to 51-N, respectively. In this case, output terminals of the constant currents Is of the constant current sources 51-$n$ (n=1, 2, ..., N) are connected to one end of a resistor 63 having a resistance value Rdac and an output terminal T1 via a contact point "a" of the switch 52-$n$ and connected to a connection terminal T4 of another end of the resistor 63 via a contact point "b" of the switch 52-$n$ and one end of a resistor 62 having a resistance value Rtail2. That is, the resistor 63 is connected between the output terminal T1 and the connection terminal T4, the connection terminal T4 is connected to an output terminal T2 via the resistor 62, and the connection terminal T2 is grounded via the resistor 61 having a resistance value Rtail1. A resistance controller 60 receives an input of a resistance value control signal of a total of 3m bits configured by including m bits for designating each of the resistance values of the three resistors 61, 62 and 63, and the resistance controller 60 performs control so that the resistance value Rdac of the resistor 63, the resistance value Rtail2 of the resistor 62 and the resistance value Rtail1 of the resistor 61 become the designated resistance values on the basis of an inputted resistance value control signal Scr. In this case, the resistor 63 is a resistance Rrange for setting the voltage range of the integration ramp voltage 80, and the resistors 61 and 62 configures a resistance Roffset for setting the offset voltage of the startup voltage of the integration ramp voltage 80 from the ground voltage. It is noted that the resistor 61 has the resistance value Rtail1 for setting a reset voltage Vreset, and the resistor 62 has the resistance value Rtail2 for setting a voltage difference between the reset voltage Vreset and a base voltage Vbase, which are described later.

Moreover, the k-bit input digital value Din is inputted to a switch controller 53, which controls the switches 52-1 to 52-$n$ so that the "n" switches 52-1 to 52-$n$ are switched to the contact point "a" side and (N−n) switches 52-($n$+1) to 52-N are switched to the contact point "b" side when the input digital value Din is an integer "n" (possible within a range of $0 \leq n \leq N=2^k$). At this time, each constant current Is from at least one of the "n" constant current sources 51-1 to 51-$n$ flows through the resistors 63 to 61 as a total output current Tout (=n×Is), and each constant current Is from the (N−n) constant current sources 51-($n$+1) to 51-N flows through the resistors 62 to 61 as a total output current Idump (=(N−n)×Is). That is, in the total supply current (N×Is) from the N constant current sources 51-1 to 51-N included in a current source circuit 50, a several n-fold current (n×Is) corresponding to the input digital value is supplied as the current Iout to the resistor 63, while the remaining current (N−n)×Is is supplied as the current Idump to the resistors 62 and 61. A total current of Iout+Idump flows through the resistor 61, and the reset voltage Vreset of its induction voltage is generated and outputted to a VT converter 22 via the output terminal T2. Moreover, a total current of Iout+Idump flows through the resistor 62, and the base voltage Vbase of its induction voltage plus reset voltage Vreset is generated as a voltage at one end of the resistor 62. Further, a current Iout flows through the resistor 63, and an analog voltage (corresponding to an analog value obtained by subjecting the input digital value Din to DA conversion) Vdac of its induction voltage plus base voltage Vbase is generated and outputted to the VT converter 22 via the output terminal T1. Therefore, the generated voltages have the relation: Vdac>Vbase>Vreset.

Figure 6:
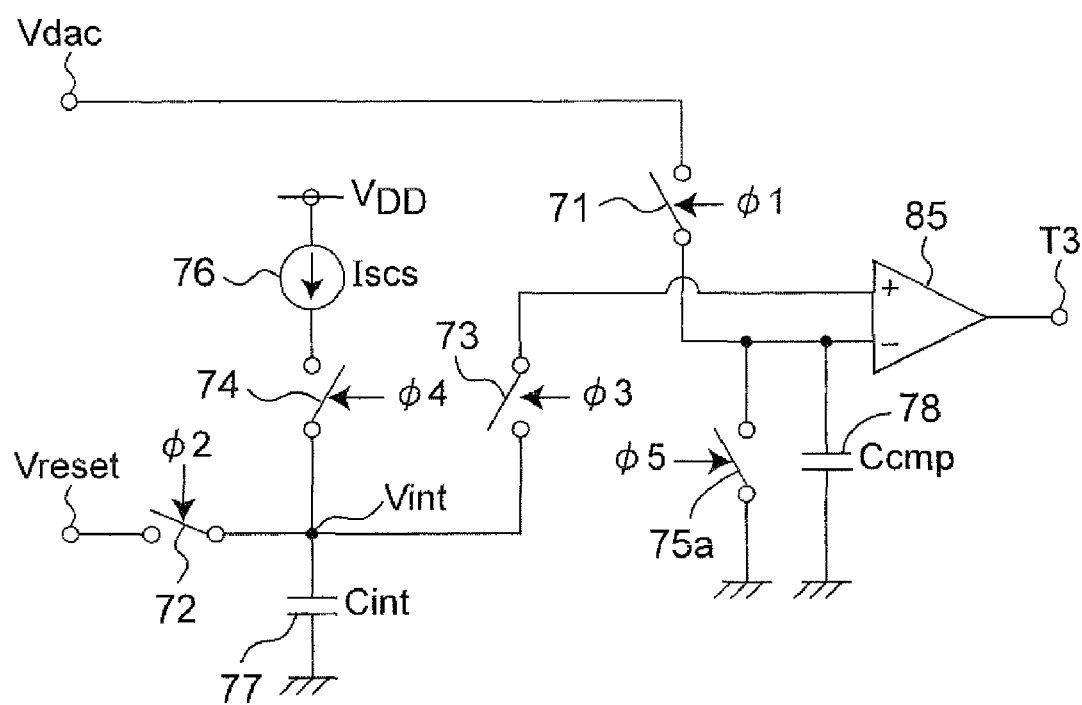
FIG. 6 is a circuit diagram showing a configuration of a VT converter 22b according to a third modified preferred embodiment of the present preferred embodiment.

In order to convert the analog voltage Vdac into a timing signal Tout corresponding to the analog voltage Vdac after the delay time from the rise time of the master clock signal Mck, the VT converter 22 is configured by including the following:

(a) a timing signal generator 70 that generates timing signals φ1, φ2, φ3, φ4 and φ5 (note that the timing signal φ5 is used in the third modified preferred embodiment of FIG. 6) shown in FIG. 2;

(b) a switch 71 that is turned on in response to an H-level timing signal φ1 and turned off in response to an L-level timing signal φ1;

(c) a switch 72 that is turned on in response to an H-level timing signal φ2 and turned off in response to an L-level timing signal φ2;

(d) a switch 73 that is turned on in response to an H-level timing signal φ3 and turned off in response to an L-level timing signal φ3;

(e) a switch 74 that is turned on in response to an H-level timing signal φ4 and turned off in response to an L-level timing signal φ4;

(f) a switch 75 that is turned on in response to the H-level timing signal φ1 and turned off in response to the L-level timing signal φ1;

(g) a constant current source 76 that is a so-called switched constant current source and is connected to the power voltage $V_{DD}$ to supply the constant current Iscs;

(h) an integration capacitor 77 having an integral capacitance Cint;

(i) a comparison voltage charging capacitor 78 having a capacitance Ccmp; and (j) an inverter 79 that operates as a converter having a threshold value of the ground voltage and outputs an H-level output signal Tout to an output terminal T3 when a voltage exceeding the ground voltage is inputted to the input terminal.

In the VT converter 22, the analog voltage Vdac from the output terminal T1 of the DA converter 21 is applied to a connection terminal T6 via the switch 71. The reset voltage Vreset from the output terminal T2 of the DA converter 21 is applied to a connection terminal T5 via the switch 72. The constant current source 76 supplies the constant current Iscs to one end of the integration capacitor 77 via the switch 74 and the connection terminal T5, and another end of the integration capacitor 77 is grounded. The integral voltage Vint of the integration capacitor 77 is applied via the switch 73 to the connection terminal T6, and the connection terminal T6 is connected via the comparison voltage charging capacitor 78 to the input terminal of the inverter 79. The input terminal of the inverter 79 is connected via the switch 75 to the output terminal of the inverter 79 and the output terminal T3 of the VT converter 22.

In the present preferred embodiment, the current Iscs from the switched constant current source 76 is integrated in the integration capacitor 77, and its initial voltage is set to the reset voltage Vreset. An integral voltage Vint(t) after a lapse of time interval "t" from timing t2 of FIG. 2 is expressed by the following equation:

$$Vint(t)=t\times Iscs/Cint+Vreset \qquad (1),$$

where the integral voltage Vint(t) corresponds to the slope input of the comparator (configured by including the inverter 79) in the subsequent stage. Moreover, assuming that a maximum delay time generated by the timing signal generator circuit 20 is Tmax (See FIG. 2), the current Iscs of the constant current source 76 needs to be set so as to satisfy the following equation:

$$Vmax=Tmax\times Iscs/Cint+Vreset<<V_{DD} \qquad (2),$$

where $V_{DD}$ is the power voltage. This is intended to prevent the voltages at the open ends of the integration capacitor 77 and the comparison voltage charging capacitor 78 from exceeding the guaranteed withstand voltage of the comparator due to current integration. Moreover, it is intended to protect the switch in addition to the comparator.

Next, the operation of the timing signal generator circuit 20 is described below with reference to FIGS. 1 and 2.

At timing t0, the k-bit input digital value Din=n and the 3m-bit resistance value control signal Scr are first inputted, switchover of the switches 52-1 to 52-N is set so as to correspond to the input digital value Din=n, and the resistance values Rtail1, Rtail2 and Rdac of the three resistors 61, 62 and 63 are set so as to correspond to the resistance value control signal Scr. Moreover, the timing signals φ1 and φ2 are set to H level, and the timing signals φ3 and φ4 are set to L level. At this timing, the switches 71, 72 and 75 are turned on, and the switches 73 and 74 are turned off. Then, the analog voltage Vdac generated as described above by the constant current source circuit 50 including the N constant current sources 51-1 to 51-N is applied from the output terminal T1 via the switch 71 to the comparison voltage charging capacitor 78 to be accumulatively charged (the switch 75 is turned on and the inverter 79 becomes inoperative at this timing). The reset voltage Vreset generated as described above by the constant current source circuit 50 is applied from the output terminal T2 via the switch 72 to the integration capacitor 77 to be accumulatively charged. Subsequently, at timing t1, the timing signal φ1 is set to L level, the switches 71 and 75 are turned off to end the charging into the comparison voltage charging capacitor 78, and the analog voltage Vdac and the inverter 79 of the comparator are disconnected.

Next, when an H-level master clock signal Mck is inputted at timing t2, the timing signal φ2 is set to L-level. At this timing, the reset voltage Vreset and the integration capacitor 77 are disconnected, integration into the integration capacitor 77 is started, and the integral voltage Vint rises in proportion to time interval "t" as the time elapses (ramp voltage 80 of FIG. 2). Then, at timing t3 after a lapse of a predetermined time from timing t2, the switch 73 is turned on to connect the integration capacitor 77 with the inverter 79 of the comparator, and timing t4 at which the integral voltage Vint>analog voltage Vdac is searched. At timing t4, an H-level timing signal Tout is outputted from the inverter 79, and the switch 74 is turned off to stop the integrating operation at subsequent timing t5.

That is, the timing signal generator circuit 20 of the present preferred embodiment performs control so as to charge the integration capacitor 77 with the reset voltage Vreset, charge the comparison voltage charging capacitor 78 with the analog voltage Vdac, connect another end of the comparison voltage charging capacitor 78 to the ground via the integration capacitor 77, and thereafter, charge the integration capacitor 77 with the constant current Tscs from the constant current source 76. Then, by comparing the integral voltage Vint of the integration capacitor 77 with the analog voltage charged in the comparison voltage charging capacitor 78, the predetermined timing signal Tout is outputted when the integral voltage Vint exceeds the analog voltage Vdac.

In the timing signal generator circuit 20 configured as above, by voltage division by the resistor 61 and the resistor 62, the reset voltage Vreset is set so as to be generally several hundred millivolts lower than the base voltage Vbase (equal to the analog voltage Vdac when n=0, in a case where no voltage drop occurs at the resistor 63) at which the search of VT conversion is started at timing t3. With this arrangement, as shown in the simulation results of FIG. 8, the nonlinear voltage fluctuation (momentary rise) of the integral voltage Vint at the integration start timing t2 of the integration capacitor 77 can be taken in between the base voltage Vbase and the reset voltage Vreset and put outside the linear range required for the integral voltage Vint. Therefore, there can be provided a timing generator circuit, which can reduce the portion in which the conversion characteristic from the input digital value Din to the delay time is nonlinear and has higher accuracy and higher resolution than those of the prior arts.

Moreover, as apparent from the timing chart of FIG. 2, since the switch 74 is turned on by the timing signal φ4 to supply the integration current from the switched constant current source 76 at timing t1 before timing t2 at which the integration capacitor 77 starts the integrating operation, the nonlinearity (in concrete, the nonlinearity such that the MOS field-effect transistor that configures the constant current source 76 is turned on) of the time-to-supply current value at the rise time when the constant current source 76 starts up can be removed. Therefore, there can be provided a timing signal generator circuit, which can further reduce the portion in which the conversion characteristic from the input digital value Din to the delay time is nonlinear and has higher accuracy and higher resolution than those of prior arts.

In the above preferred embodiment, the delay time set point can be changed in accordance with the input digital value Din by changing the resistance value Rdac of the resistor 63, and the delay time per one LSB can be further changed.

Figure 11:
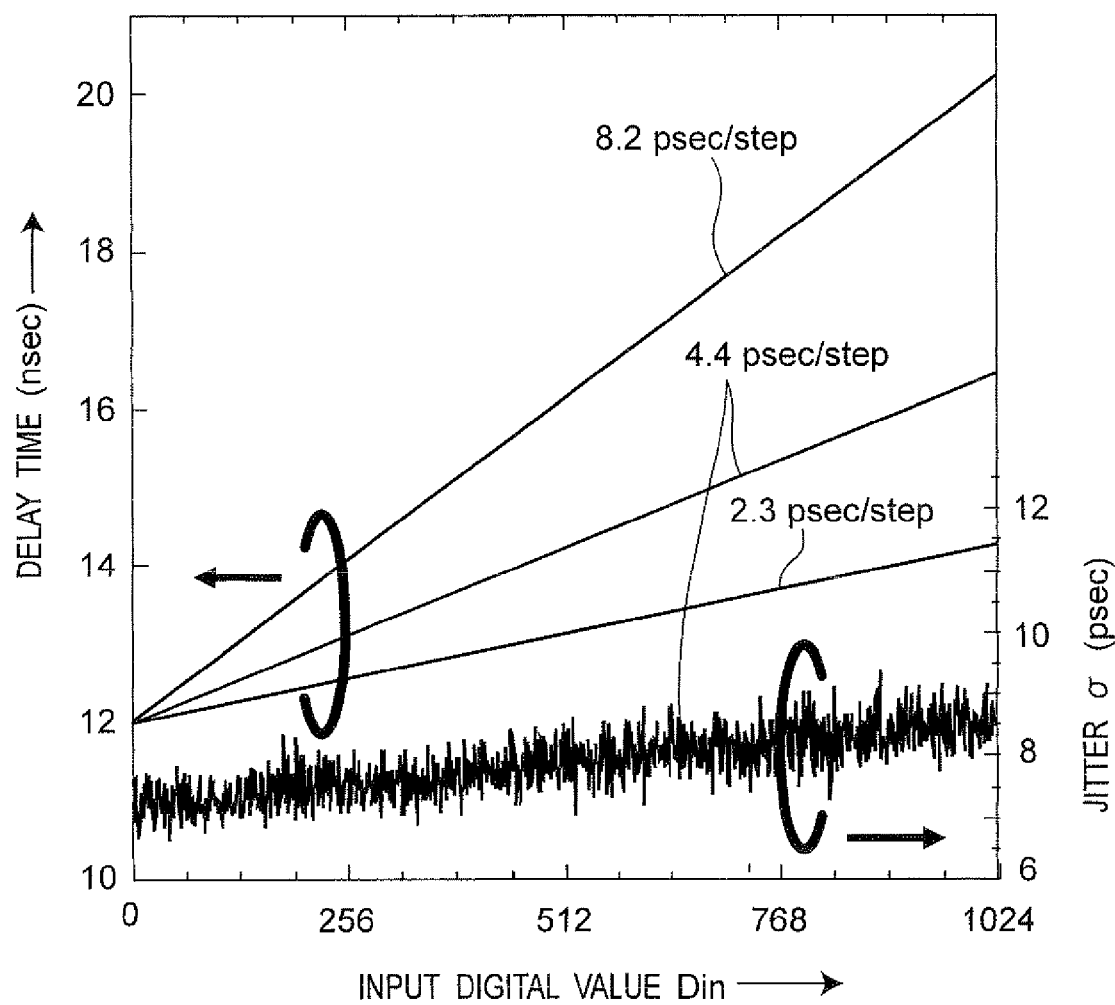
FIG. 11 is a graph showing a characteristics of the delay time and a jitter σ with respect to the input digital value Din according to actual measurement results (third implemental example) of the sampling timing signal generator circuit 20 of FIG. 1.

Moreover, by changing the resistance value Rtail1 of the resistor 61, the resistance value Rtail2 of the resistor 62 and the current value Is of each of the constant current sources 51-1 to 51-N, a difference between the reset voltage Vreset and the base voltage Vbase can be arbitrarily set. In order to avoid the influences of the "portion in which the integral voltage Vint is nonlinear" in FIG. 8, where a change occurs due to the reset voltage Vreset, the analog voltage Vdac, the capacitance value Cint of the capacitor 77, the capacitance value Ccmp of the capacitor 78, the switch size of the switch 73 in the VT converter 22 or the like, the difference between the reset voltage Vreset and the base voltage Vbase can be adjusted. Moreover, as shown in FIG. 11, the offset value of the delay time can be concurrently adjusted. In this case, a total delay time (or time interval) T can be expressed by the following equation:

$$T = T\text{offset} + (V\text{dac} - V\text{reset}) \times C\text{int}/I\text{scs} \quad (3),$$

$$T\text{offset} \propto R\text{tail1}, R\text{tail2}, I\text{s}, \text{ or } C\text{int}/(C\text{cmp} + C\text{p}_{73}) \quad (4),$$

$$V\text{dac} \propto I\text{s} \times R\text{dac} \times D\text{in} \quad (5), \text{ and}$$

$$V\text{reset} \propto I\text{s} \times R\text{tail1} \times N \quad (6),$$

where $C\text{p}_{73}$ is the parasitic capacitance of the switch 73.

It is noted that the time interval between the rise timing of the timing signal φ3 and the fall timing of the timing signal φ2 should be smaller than the generated minimum delay time T.

Figure 3:
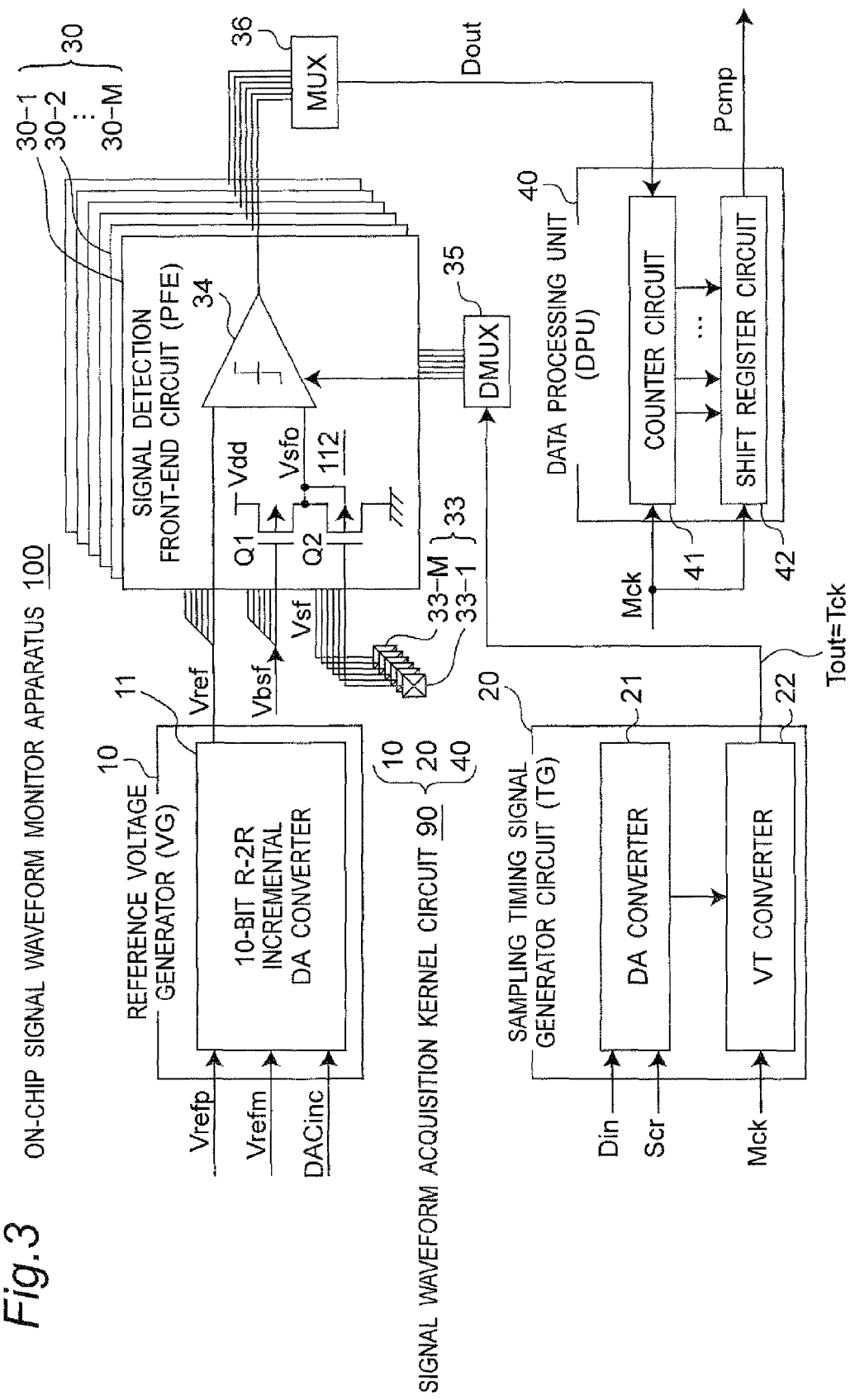
FIG. 3 is a block diagram showing a configuration of an on-chip signal waveform monitor apparatus 100 configured by including the sampling timing signal generator circuit 20 of FIG. 1.

FIG. 3 is a block diagram showing a configuration of an on-chip signal waveform monitor apparatus 100 configured by using the sampling timing signal generator circuit 20 of FIG. 1.

FIG. 3 shows the system configuration of the entire device, in which the circuit of the multi-channel on-chip signal waveform monitor apparatus 100 is mounted on an LSI chip in an on-chip manner. A plurality of probing front-end (Probing Front-End) circuit 30 having a comparatively small area are placed for signal detection in the proximity of detection points 33 for measuring the objective signal in the vicinity of the function circuit block, the signals to be detected are probed at the detection points 33, and detection signals are outputted from the probing front-end circuits 30. A signal waveform acquisition kernel (Waveform Acquisition Kernel) circuit 90 that generates signals necessary for waveform detection is singly placed in the LSI chip, and all the probing front-end circuits 30 share one signal waveform acquisition kernel circuit 90.

The on-chip signal waveform monitoring apparatus 100 of FIG. 3 is configured by including the following:

(a) the signal waveform acquisition kernel circuit 90 configured by including a reference voltage generator (Reference Voltage Generator: VG) 10, a sampling timing signal generator circuit (Sampling Timing Generator: TG) 20, and a data processing unit (Data Processing Unit: DPU) 40; and (b) the plurality of M probing front-end (Probing Front-End: PFE) circuits 30.

In this case, a reference voltage generator 10 is configured by including a 10-bit R2-2 ladder type incremental DA converter 11, and the DA converter 11 generates a reference voltage Vref on the basis of inputted three signals (reference positive voltage Vrefp, a reference negative voltage Vrefm, and a DA converter increment signal DACinc (reference voltage increment signal) and outputs the same to the probing front-end circuits 30. Moreover, as described above, the sampling timing signal generator circuit 20 is configured by including the DA converter 21 that converts the digital value Din into an analog voltage, and the VT converter 22 that generates a timing signal Tout=Tck by delaying from the rise timing of the master clock signal Mck by a delay time corresponding to the analog voltage. The entire sampling timing signal generator circuit 20 configures a DT converter for converting the input digital value Din into the timing signal Tout having a delay time corresponding to the input digital value Din. In this case, the master clock signal Mck is generated by dividing the frequency of a system clock signal Sck by, for example, a quarter.

A demultiplexer 35 time-sharingly selects and operates the probing front-end circuits 30 by multiply separating a multiplexed enable timing control signal Tck configured by including a plurality of enable timing signals from the delayed signal generator circuit 22 and outputting the enable timing signals to the respective probing front-end circuits 30. Then, digital output signals from the probing front-end circuits 30 are multiplexed by a multiplexer 36, and thereafter, a multiplexed digital output signal Dout is outputted to the counter circuit 41 of the data processing unit 40.

Each of the probing front-end circuits 30 is configured by including a source follower circuit 112 (a p-channel source follower circuit 112 is shown as an example of FIG. 3) that is configured by including two p-channel MOSFETs Q1 and Q2 that operate by a bias voltage Vbsf, buffer amplifies a detection voltage Vsf from each detection point 33 and outputs the same as a detection voltage Vsfo, and a latch comparator 34 that compares the detected voltage Vsf with the reference voltage Vref from the reference voltage generator 10 at a timing of the enable timing signal in the enable timing control signal Tck of the sampling clock and outputs a digital output signal of the comparison result as a multiplex digital output signal to the data processing unit 40 via the multiplexer 36. The data processing unit 40 is configured by including a 10-bit counter circuit 41 and a 10-bit shift register circuit 42. In this case, the counter circuit 41 calculates a determination output probability Pcmp by counting the number of "1s" of the multiplex digital output signal for each comparing operation of the reference voltage Vref at each detection point 33, and the shift register circuit 42 converts the calculated determination output probability Pcmp into 10-bit serial digital data Pcmp and outputs the same. That is, the number of "1s" of the multiplex digital output signal corresponds to the determination output probability Pcmp for each reference voltage Vref at each detection point 33. It is noted that the data processing unit 40 is characterized by outputting serial data of a constant determination output probability when both the detection voltage Vsf and the reference voltage Vref are constant.

As described above, according to the timing signal generator circuit of the present preferred embodiment, the analog voltage Vdac from the DA converter 21 is converted into the amount of delay on the time axis by the comparator of the comparison means, and therefore, a multi-bit configuration can be provided with keeping the circuit current for generating the delay constant. Moreover, since the VT converter 22 can be configured in a small area substantially of one comparator, a timing signal generator circuit having higher time resolution and higher accuracy than those of the prior arts can be actualized by, for example, the fast switching characteristic of a nanometer device.

That is, the VT converter 22 is configured by comparing the integration ramp voltage 80 of the integral voltage Vint by integrating the bias current Iscs on the unit capacitance of the integration capacitor 77 from the constant current source 76 with the analog voltage Vdac charged from the DA converter 21 into the comparison voltage charging capacitor 78 used as a reference voltage (threshold voltage) by the inverter 79 of the comparator. In this case, charging of the integral voltage Vint is started from the reset voltage Vreset generated by the DA converter 21, and searching of VT conversion is started from the base voltage Vbase (>Vreset) generated by the DA converter 21. This leads to that the nonlinear voltage fluctuation (momentary rise) of the integral voltage Vint at the integral start timing t2 of the integration capacitor 77 can be taken in between the base voltage Vbase and the reset voltage Vreset and placed outside the linear range required for the integral voltage Vint (See FIG. 8). For the above reasons, a multi-bit configuration can be provided with the amount of the circuit current kept constant, and therefore, a higher resolution, higher performance and lower jitter property than those of the prior arts can be obtained.

Moreover, since the integral current is supplied by starting up the switched constant current source 76 at timing t1 before timing t2 when the integrating operation of the integration capacitor 77 starts, the nonlinearity of time-to-supply current value at the rise time when the constant current source 76 starts up can be removed. Therefore, there can be provided a timing signal generator circuit that can further reduce the portion in which the conversion characteristic from the input digital value Din to the delay time and has higher accuracy and higher resolution than those of the prior arts.

Modified Preferred Embodiments of Preferred Embodiment

Figure 4:
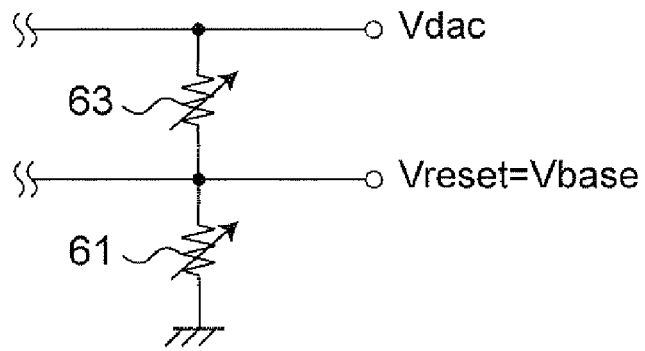
FIG. 4 is a circuit diagram showing a configuration of a part of a DA converter 21a according to a first modified preferred embodiment of the present preferred embodiment.

FIG. 4 is a circuit diagram showing a configuration of a part of a DA converter 21a according to the first modified preferred embodiment of the present preferred embodiment. Referring to FIG. 4, it is characterized in that the resistor 62 is removed and the resistor 61 is directly serially connected to the resistor 63 in comparison with the DA converter 21 of FIG. 1. With this arrangement, the reset voltage Vreset and the base voltage Vbase become an identical voltage. That is, the reset voltage Vreset may be raised and set to the base voltage Vbase.

Figure 5:
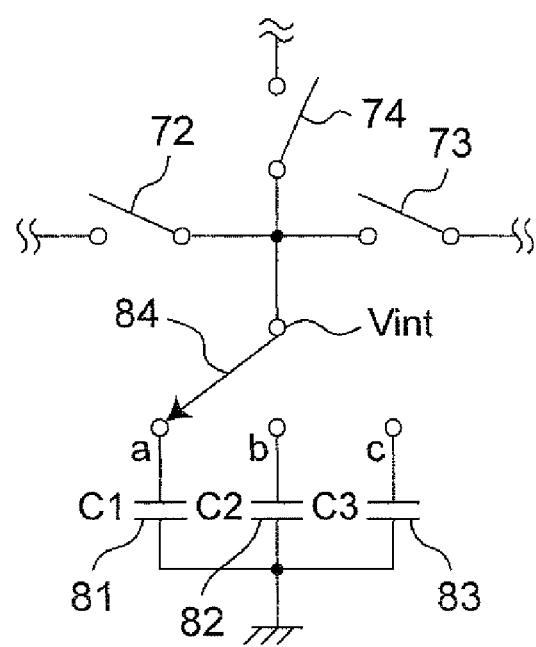
FIG. 5 is a circuit diagram showing a configuration of a part of a VT converter 22a according to a second modified preferred embodiment of the present preferred embodiment.

FIG. 5 is a circuit diagram showing a configuration of a part of a VT converter 22a according to the second modified preferred embodiment of the present preferred embodiment. Referring to FIG. 5, it is characterized in that the integration capacitor 77 configures a variable capacitor capable of changing the capacitance by selective switchover among three capacitors 81, 82 and 83 threshold value mutually different capacitances C1, C2 and C3 by a switch 84 in comparison with the VT converter 22 of FIG. 1. With this arrangement, the charging time of the integration capacitor can be changed, and the slope of the integration ramp voltage 80 can be changed. For example, by decreasing the capacitance value, the slope of the integration ramp voltage 80 can be increased to be operated at high speed.

FIG. 6 is a circuit diagram showing a configuration of a VT converter 22b according to the third modified preferred embodiment of the present preferred embodiment. The configuration of FIG. 6 differs from the VT converter 22b of FIG. 1 in the following points.

(a) A comparator 85 is provided in place of the inverter 79.

(b) The analog voltage Vdac from the DA converter 21 is inputted to the inverted input terminal of the comparator 85 via the switch 71, and the inverted input terminal is grounded via the comparison voltage charging capacitor 78 and grounded via a switch 75a controlled by a timing signal φ5.

(c) The integral voltage Vint is inputted to the non-inverted input terminal of the comparator 85 via the switch 73.

In the VT converter 22b of the third modified preferred embodiment configured as above, as shown in FIG. 2, the switch 75a is turned on in response to an H-level timing signal φ5, and a voltage that has been charged in the comparison voltage charging capacitor 78 is discharged before the initial processing. At timing t0, the switch 71 is turned on by an H-level timing signal φ1, and the switch 72 is turned on by an H-level timing signal φ2. At this timing, the reset voltage Vreset from the DA converter 21 is applied to and charged into the integration capacitor 77, and the analog voltage Vdac from the DA converter 21 is applied to the comparison voltage charging capacitor 78 and set as the threshold voltage (reference voltage) of a comparator 85. Next, at timing t3, the switch 73 is turned on in response to an H-level timing signal φ3 to connect the integration capacitor 77 to the non-inverted input terminal of the integration capacitor 77, and the comparator 85 searches for a timing t4 at which the integral voltage Vint>analog voltage Vdac. At timing t4, an H-level timing signal Tout is outputted from the comparator 85, and the switch 74 is turned off at a subsequent timing t5 to stop the integrating operation.

That is, the control is performed to charge the integration capacitor 77 with the reset voltage Vreset, charge the comparison voltage charging capacitor 78 with the analog voltage Vdac, connect another end of the comparison voltage charging capacitor 78 to the ground via the integration capacitor 77 and thereafter perform charging of the constant current Nes from the constant current source 76 after the upper-end voltage of the integration capacitor 77 is stabilized. Then, by comparing the integral voltage Vint of the integration capacitor 77 with the analog voltage charged in the comparison voltage charging capacitor 78, the predetermined timing signal Tout is outputted when the integral voltage Vint exceeds the analog voltage Vdac. Therefore, the VT converter 22b of the third modified preferred embodiment has an operative effect similar to that of the VT converter 2 of FIG. 1.

Although the constant current values Is and Iscs of the constant current sources 51-1 to 51-N and 76 are fixed in the above preferred embodiment and modified preferred embodiments, it is acceptable to make the current values Is and Iscs variable by changing the bias voltage in the bias voltage circuit. In this case, the delay time set point can be changed in accordance with the input digital value Din by charging the current value Is, and the delay time per one LSB can further be changed.

FIRST IMPLEMENTAL EXAMPLE

Figure 7:
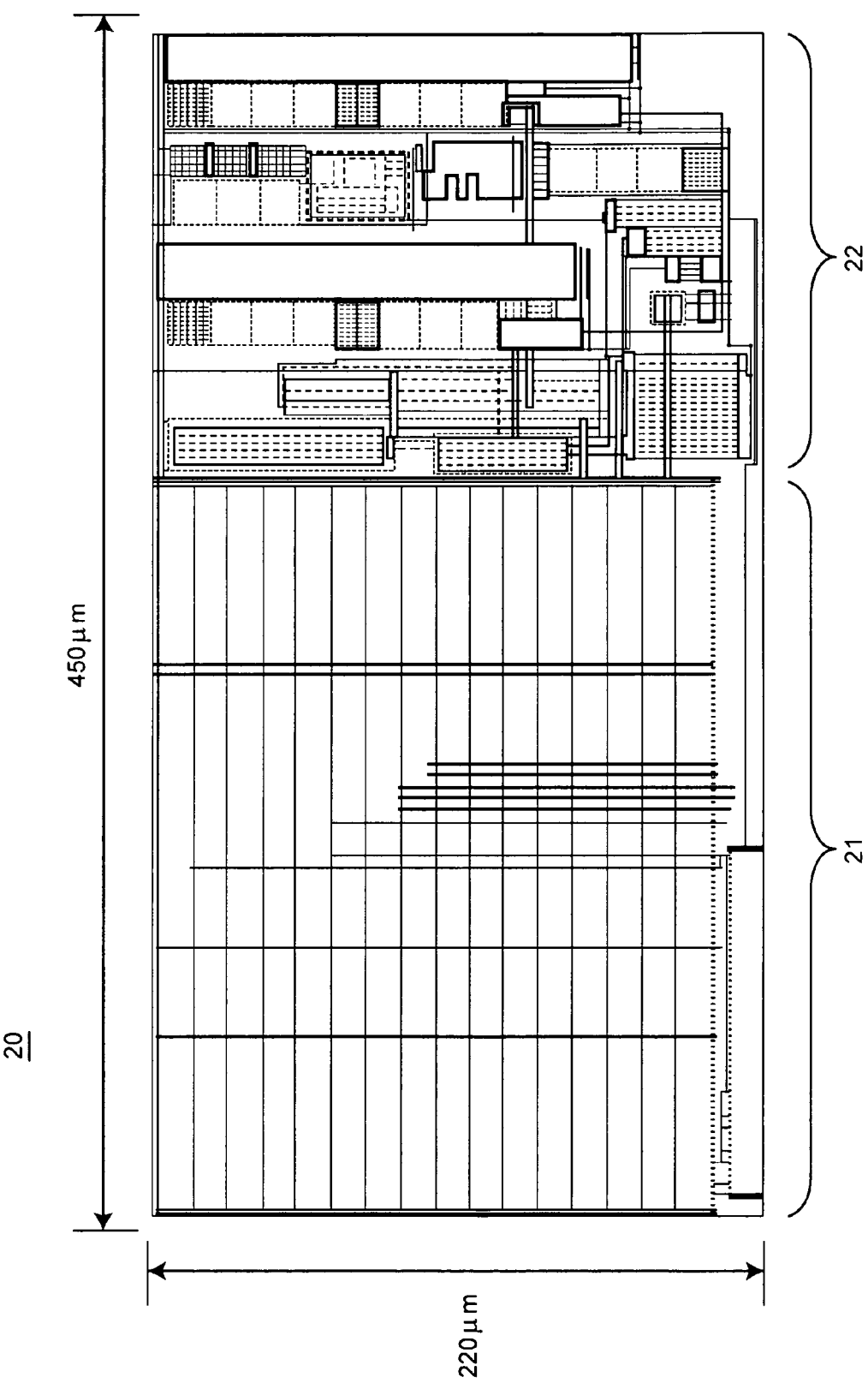
FIG. 7 is a CAD drawing showing a first implemental example of the sampling timing signal generator circuit 20 of FIG. 1 experimentally produced by a 90-nm CMOS technology.

FIG. 7 is a CAD drawing showing a first implemental example of the sampling timing signal generator circuit 20 of FIG. 1 experimentally produced by the 90-nm CMOS technology. As is apparent from FIG. 7, the sampling timing signal generator circuit 20 is formed in a substrate of 450 μm×220 μm. The present inventor and others conducted a circuit simulation and a test chip measurement described later by using the sampling timing signal generator circuit 20 experimentally produced.

Figure 8:
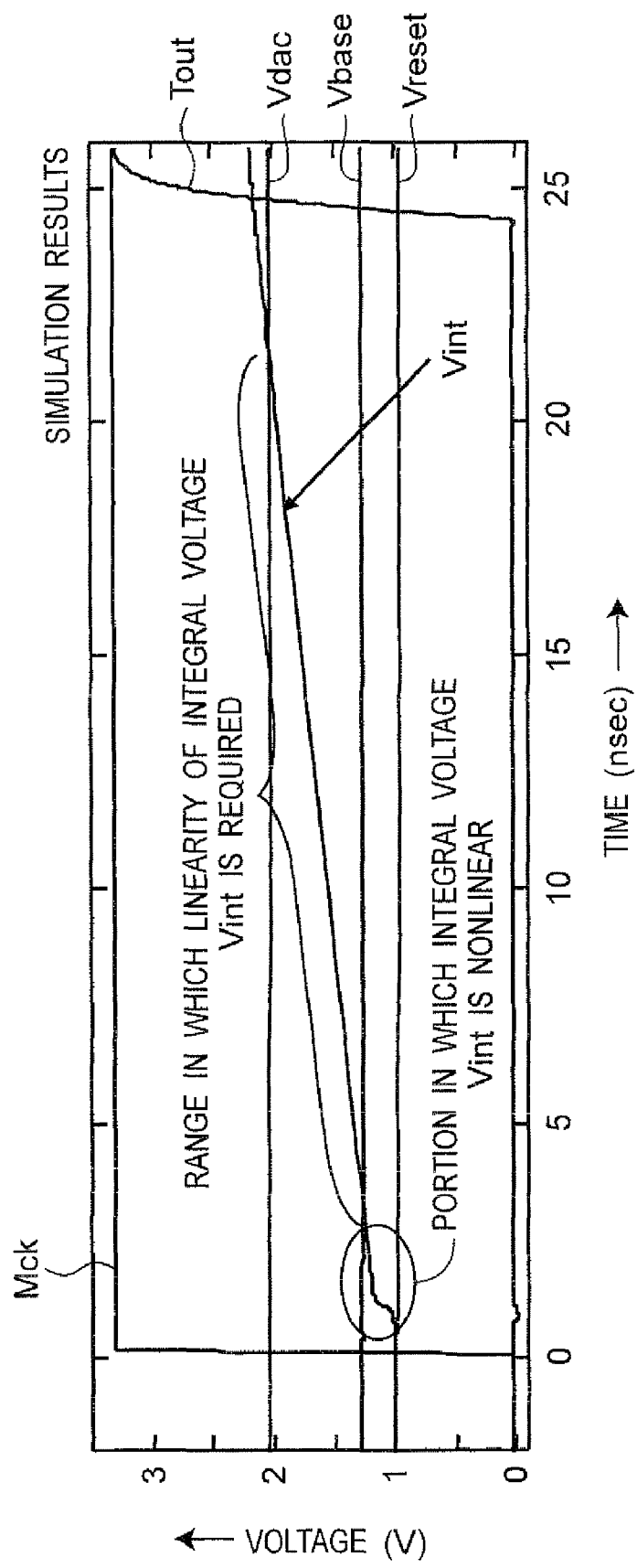
FIG. 8 is a graph showing relations between control voltages and voltages according to simulation results (first implemental example) of the sampling timing signal generator circuit 20 of FIG. 1.

FIG. 8 is a graph showing relations between control voltages and voltages according to the simulation results (first implemental example) of the sampling timing signal generator circuit 20 of FIG. 1. As described above, in the sampling timing signal generator circuit 20, the reset voltage Vreset is generally set to be lower than the base voltage Vbase by several hundred millivolts by voltage division by the resistor 61 and the resistor 62. With this arrangement, as shown in the simulation results of FIG. 8, the nonlinear voltage fluctuation (momentary rise) of the integral voltage Vint at the integration start timing t2 of the integration capacitor 77 can be taken in between the base voltage Vbase and the reset voltage Vreset and placed outside the linear range required for the integral voltage Vint. With this arrangement, the accuracy and the resolution of the timing signal generator circuit 20 can be remarkably improved in comparison with the prior arts.

SECOND IMPLEMENTAL EXAMPLE

Figure 9:
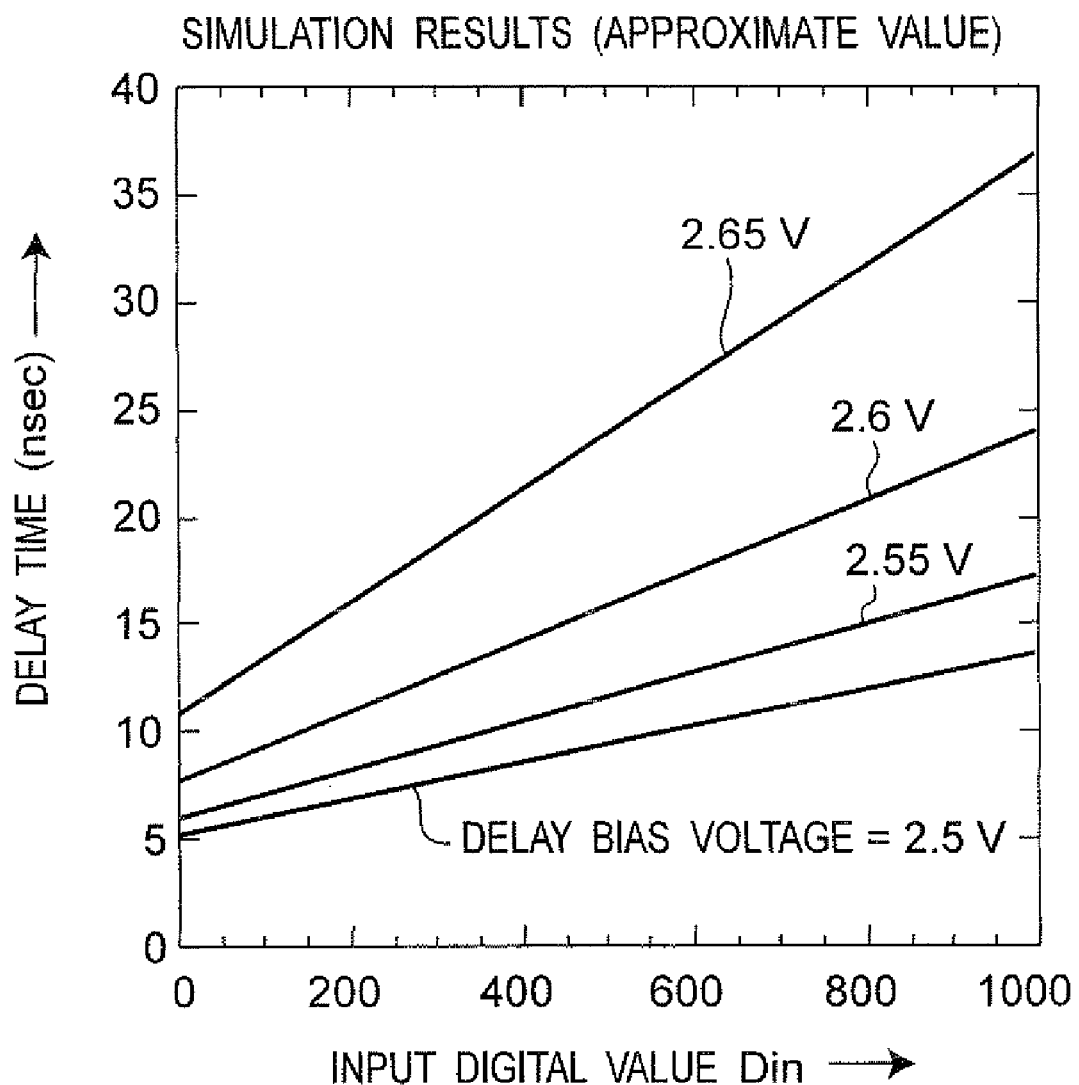
FIG. 9 is a graph showing a characteristic of a delay time with respect to an input digital value Din according to simulation results (second implemental example) of the sampling timing signal generator circuit 20 of FIG. 1.
Figure 10A:
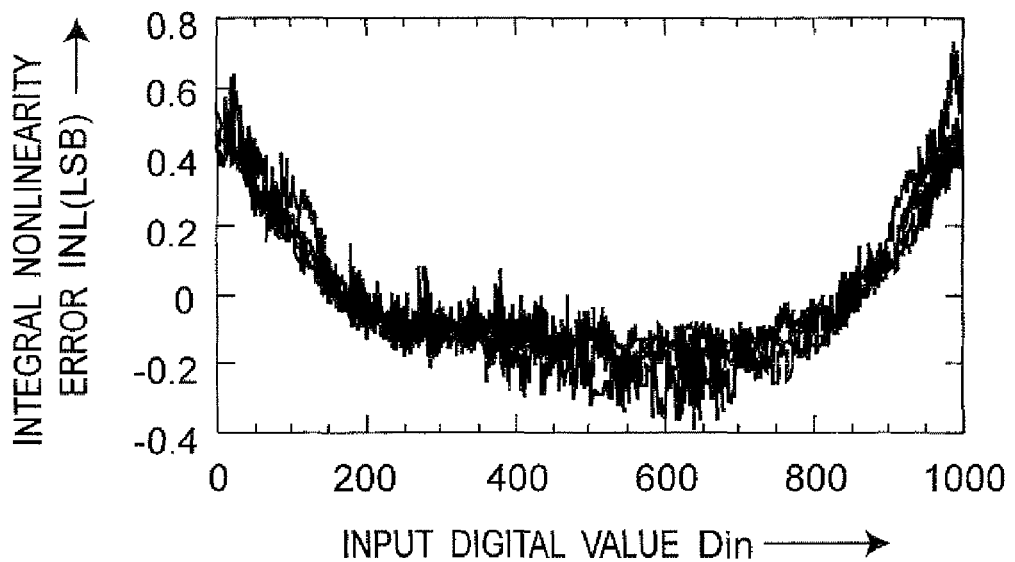
FIG. 10A is a graph showing simulation results (second implemental example) when the resolution is set to 10 bits in the sampling timing signal generator circuit 20 of FIG. 1, and showing a characteristic of an integral nonlinearity error INL (Integral Non-Linearity) from the stepsize of one LSB with respect to the input digital value Din.
Figure 10B:
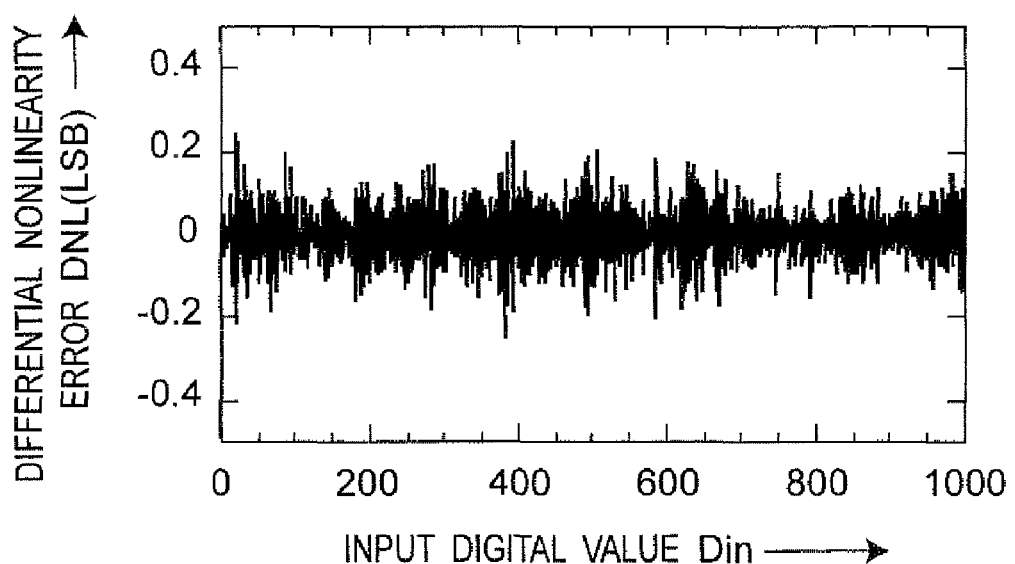
FIG. 10B is a graph showing a graph showing simulation results (second implemental example) when the resolution is set to 10 bits in the sampling timing signal generator circuit 20 of FIG. 1, and a characteristic of a differential nonlinearity error DNL (Differential Non-Linearity) per the stepsize with respect to the input digital value Din.

FIG. 9 is a graph showing a characteristic of the delay time with respect to the input digital value Din according to the simulation results (second implemental example) of the sampling timing signal generator circuit 20 of FIG. 1. FIGS. 10A and 10B are graphs showing a simulation results (second implemental example) when the resolution is set to 10 bits in the sampling timing signal generator circuit 20 of FIG. 1. FIG. 10A is a graph showing a characteristic of an integral nonlinearity error INL (Integral Non-Linearity) from the stepsize of one LSB with respect to the input digital value Din, and FIG. 10B is a graph showing a characteristic of a differential nonlinearity error DNL (Differential Non-Linearity) per the stepsize with respect to the input digital value Din. In this case, the differential nonlinearity error DNL is an evaluation criterion that expresses a maximum deviation from the ideal stepsize of one LSB. Moreover, the integral nonlinearity error INL expresses a deviation of each individual code based on a straight line that passes through the transfer function from the input to the output. The deviation from the straight line to an arbitrary input digital value Din (code value) is measured from the center of each input digital value Din (code value), and an end-point method is generally used.

FIGS. 9, 10A and 10B show the evaluation results of the timing generation performance by circuit simulation, and as apparent from FIG. 9, it can be understood that the timing signal Tout is outputted by adding a delay time corresponding to the code value to the input digital value Din. FIG. 9 is the graph showing a relation between the input digital value Din (code value) and the delay time, in which the amount of a total delay is changed by changing a delay bias voltage that determines the constant current Iscs of the constant current source 76.

Moreover, the input digital value Din (code value) was changed to increase by the predetermined stepsize in proportion to a lapse of time.

FIGS. 10A and 10B showed the timing accuracy in the circuit simulation, in which the resolution was set to 10 bits and evaluations were made by using the integral nonlinear error INL and the differential nonlinear error DNL as indexes. As is apparent from FIGS. 10A and 10B, it could be confirmed that a sufficient linearity was possessed in each condition.

THIRD IMPLEMENTAL EXAMPLE

Figure 12A:
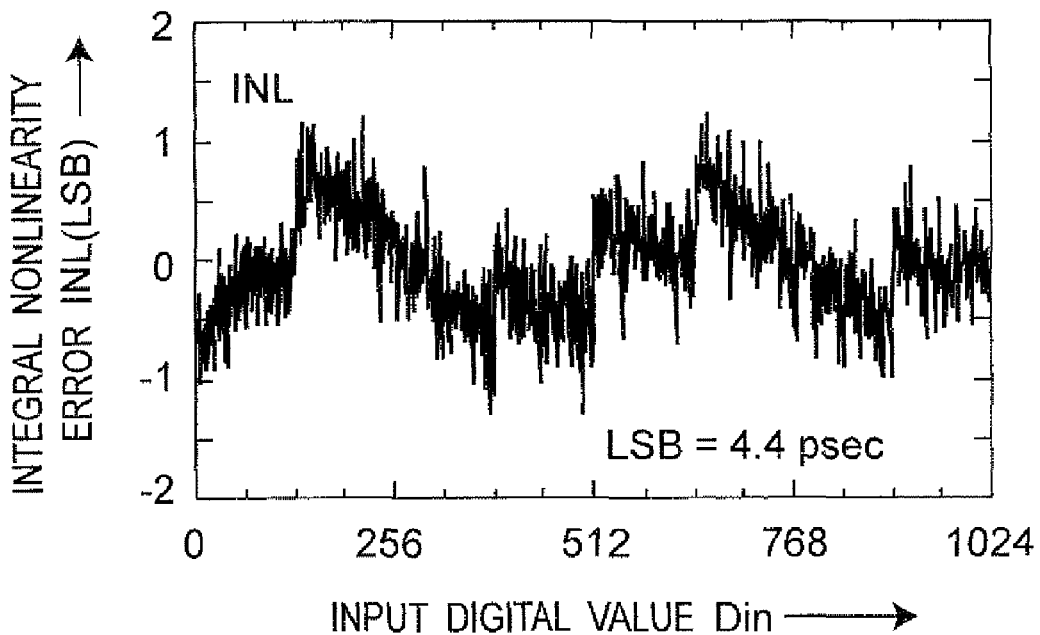
FIG. 12A shows actual measurement results (third implemental example) of the sampling timing signal generator circuit 20 of FIG. 1, and is a graph showing a characteristic of the integral nonlinearity error INL (Integral Non-Linearity) from the stepsize of one LSB with respect to the input digital value Din.
Figure 12B:
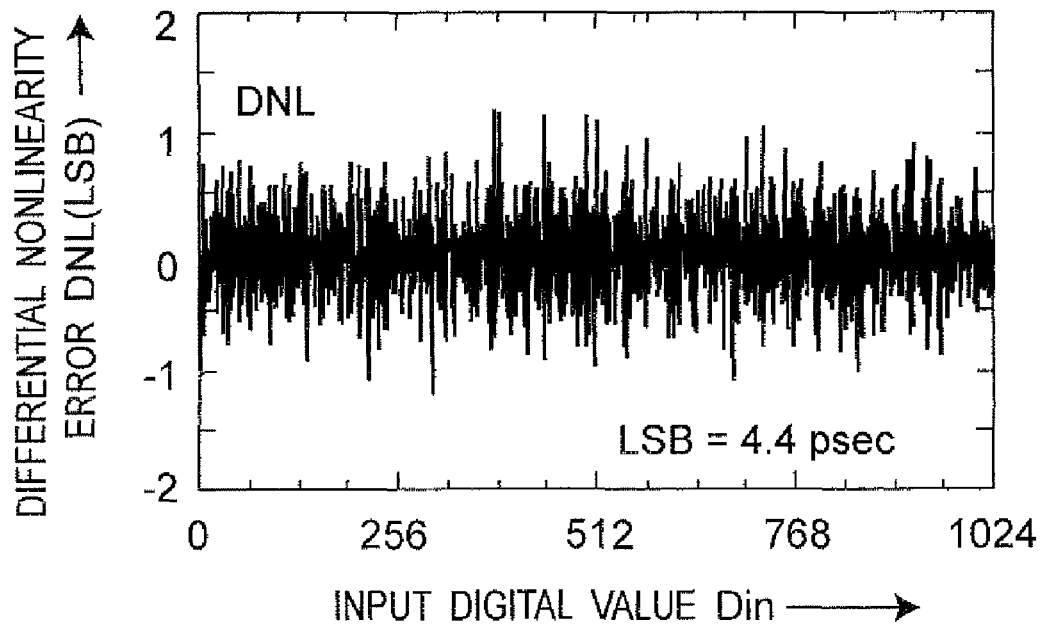
FIG. 12B shows actual measurement results (third implemental example) of the sampling timing signal generator circuit 20 of FIG. 1, and is a graph showing a characteristic of the differential nonlinearity error DNL (Differential Non-Linearity) per the stepsize with respect to the input digital value Din.
Figure 13:
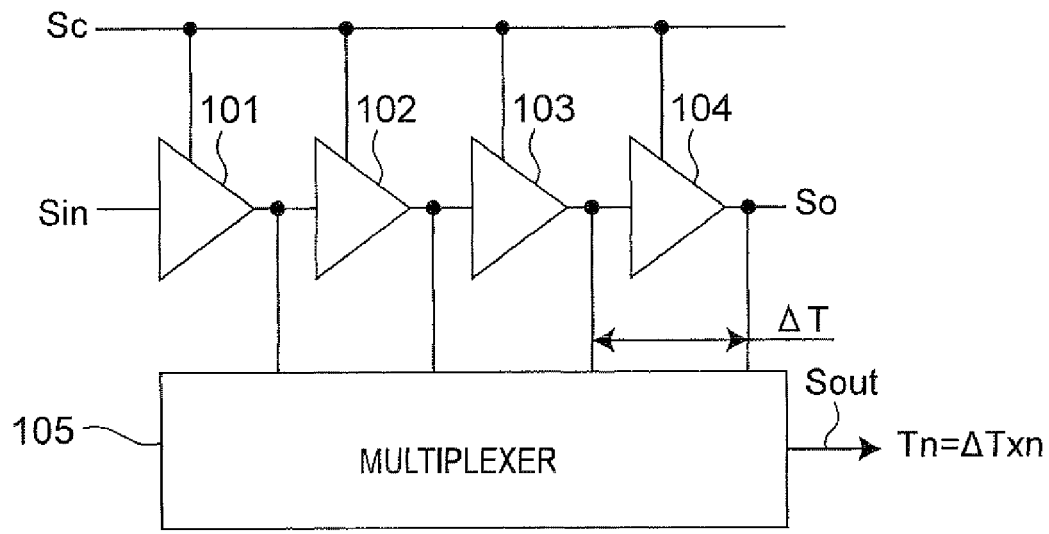
FIG. 13 is a block diagram showing a configuration of a timing signal generator circuit according to the first prior art.
Figure 14:
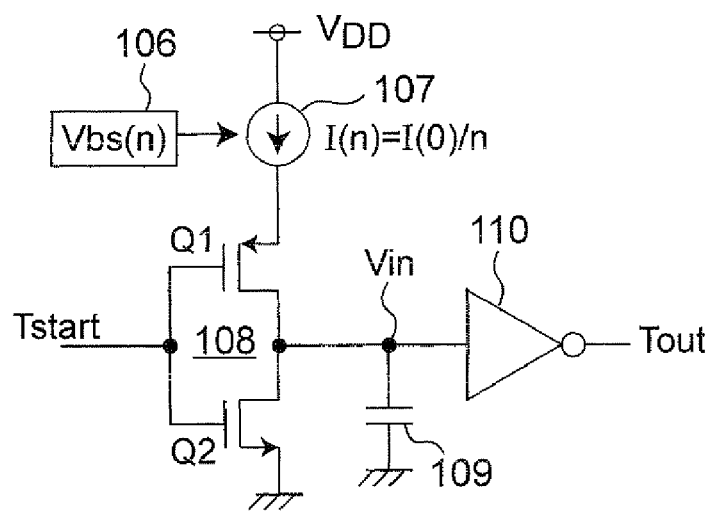
FIG. 14 is circuit diagram showing a configuration of a sampling timing signal generator circuit according to the second prior art.
Figure 15:
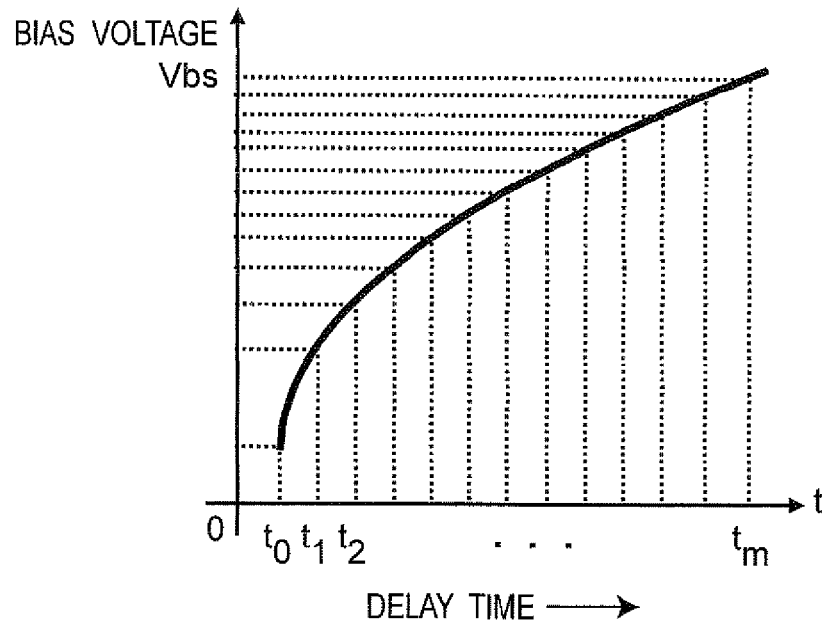
FIG. 15 is a graph showing a delay time characteristic of a bias voltage Vbs of the sampling timing signal generator circuit of FIG. 14.
Figure 16:
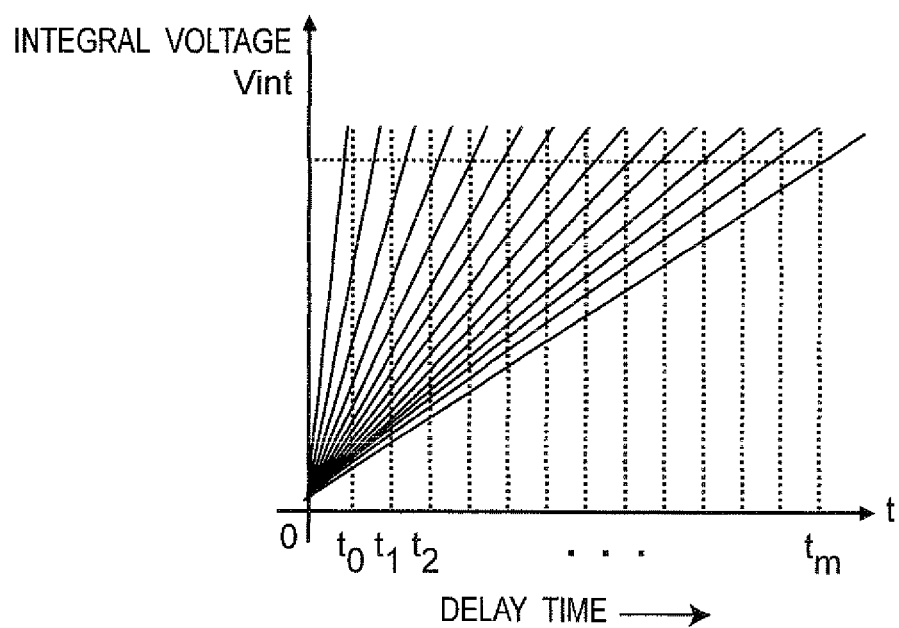
FIG. 16 is a graph showing a delay time characteristic of an input voltage Vint to a comparator (configured by including an inverter 110) of the sampling timing signal generator circuit of FIG. 14.
Figure 17:
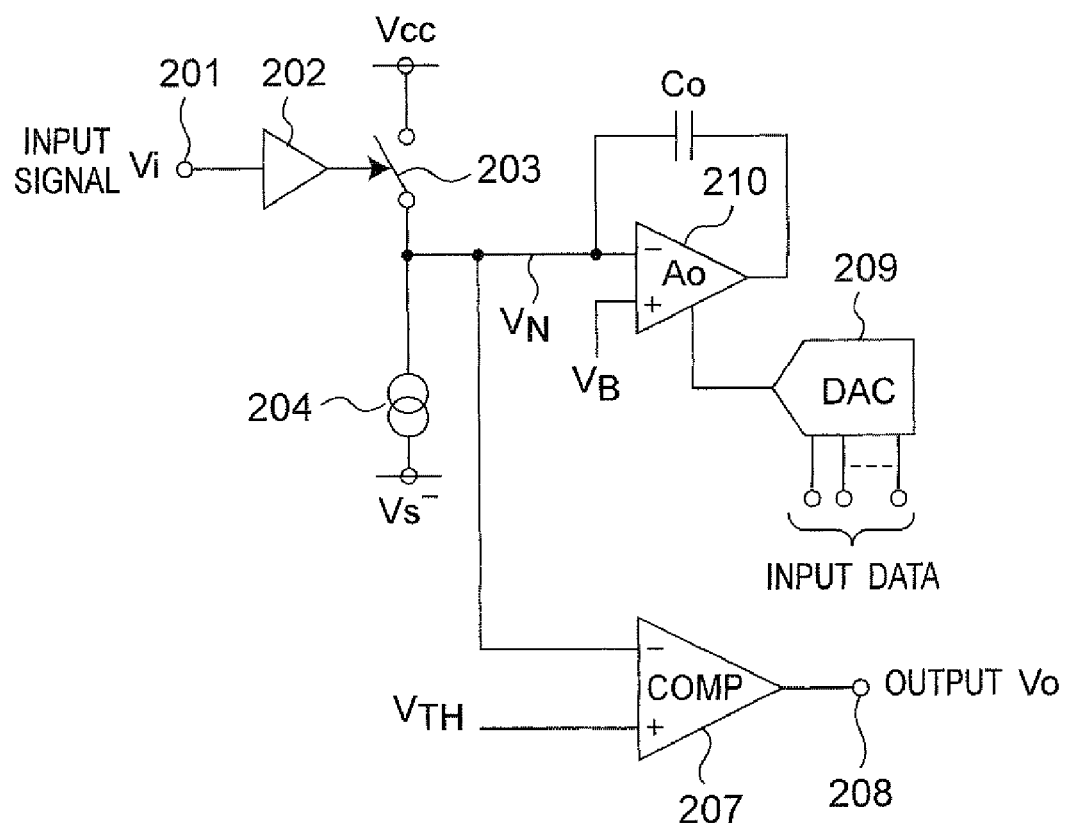
FIG. 17 is a circuit diagram showing a configuration of a sampling timing signal generator circuit according to the third prior art.

FIG. 11 is a graph showing a characteristics of the delay time and a jitter c with respect to the input digital value Din according to actual measurement results (third implemental example) of the sampling timing signal generator circuit 20 of FIG. 1. FIGS. 12A and 12B are the actual measurement results (third implemental example) of the sampling timing signal generator circuit 20 of FIG. 1. FIG. 12A is a graph showing a characteristic of the integral nonlinearity error INL (Integral Non-Linearity) from the stepsize of one LSB with respect to the input digital value Din, and FIG. 12B is a graph showing a characteristic of the differential nonlinearity error DNL (Differential Non-Linearity) per the stepsize with respect to the input digital value Din.

That is, FIGS. 11, 12A and 12B show the evaluation results of the timing generation performance by actual measurement of the test chip. As is apparent from FIG. 11, an offset of about 12 nanoseconds is added to the delay time of the actual measurement results. This is attributed to the fact that the initial voltage of the charging capacity by the resistor 61 is lowered. FIGS. 12A and 12B show the evaluation data of the integral nonlinearity error INL and the differential nonlinearity error DNL. As is apparent from FIG. 11, both the integral nonlinearity error INL and the differential nonlinearity error DNL fall within about ±2 when one LSB=8.2 pocoseconds at the best performance. Therefore, it can be considered that a linearity of about 9 bits is possessed at a resolution of 8.2 picoseconds. Moreover, since the same current source array as that of the voltage generator 10 of FIG. 3 is used in the measurement system, it can be confirmed that a large leap occurs when a specific code value (input digital value Din) changes in a manner similar to that of the characteristics of the integral nonlinearity error INL and the differential nonlinearity error DNL of the reference voltage generator 10. Moreover, as apparent from FIGS. 12A and 12B, an output jitter of the timing signal was not greater than 8 picoseconds (rms) in the case of a resolution of 4.4 picoseconds, and it could be also confirmed that a dynamic timing fluctuation is sufficiently small.

FOURTH IMPLEMENTAL EXAMPLE

The timing signal generator circuit 20 of the first implemental example of FIG. 7 can be used for the on-chip signal waveform monitor apparatus 100 of FIG. 3 as described above. The circuit can be applied to delay time measurement of the internal logic gate of the digital circuit that configures a VLSI by using the monitor apparatus 100. The switching time of the CMOS logic gate is generally about several tens of femtoseconds to one picosecond, and the propagation time of the digital value from the input to the output of a logic gate chain in which several tens of the gates are connected in series can be measured with high resolution by using the timing generator circuit. In the on-chip signal waveform monitor apparatus 100 of FIG. 3, a logic value is inputted to the input terminal 33, and the logic value at the output terminal is latched delayed by the delay time of the timing signal generator circuit 20. In this case, by sweeping the digital delay time of the timing signal generator circuit 20 to evaluate what timing the correct logic value appears in the output, the delay time of the logic gate chain is measured. This method can be applied to an experiment to evaluate how the delay time of the logic gate chain fluctuates due to dynamic power noises, for example, inside a microprocessor.

As described in detail above, according to the timing signal generator circuit of the invention, the output voltage from the DA converter is converted into the amount of delay on the time base by the comparator, and therefore, a multi-bit configuration can be achieved with the circuit current in the occurrence of delay kept constant. Moreover, since the VT converter can be configured in a small area substantially of one comparator, a timing signal generator circuit having higher time resolution and higher accuracy than those of the prior arts can be actualized by, for example, the fast switching characteristic of a nanometer device. In particular, in a DA converter, since the integration is started by the reset voltage and the voltage search of VT conversion is started from the base voltage, the portion in which the integral voltage becomes nonlinear can be eliminated. Moreover, by performing the control to start up the constant current source that supplies the current for integration before the timing when the integration is performed by the integration capacitor, the portion in which the nonlinearity occurs at the startup time of the constant current source can be eliminated. Therefore, a timing signal generator circuit having higher time resolution and higher accuracy than those of the prior arts can be actualized.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A timing signal generator circuit for converting an input digital value into a timing signal having a delay time corresponding to the input digital value, the timing signal generator comprising:
    a digital-to-analog converter for converting the input digital value into an analog voltage corresponding to the input digital value; and
    an analog voltage-to-time converter for converting the analog voltage into a delay time corresponding to the analog voltage,
    wherein the digital-to-analog converter comprises:
    a first resistor for generating a predetermined reset voltage;
    a second resistor connected in series to the first resistor, the second resistor generating the analog voltage with the first resistor; and
    a current source circuit for supplying an n-fold current (n×Is) (where "n" is a number corresponding to the input digital value) as a first current from among a total supply current (N×Is) to the first and second resistors, and supplying a remaining current (N−n)×Is as a second current to the first resistor,
    wherein the digital-to-analog converter outputs a reset voltage generated by a sum of a first current flowing through the first resistor and a second current, and outputs an analog voltage of a sum of the reset voltage and a voltage generated by the first current flowing through the second resistor, and wherein the analog voltage-to-time converter comprises:
    a comparison voltage charging capacitor for charging the analog voltage;
    a first constant current source for supplying a predetermined constant current;
    an integration capacitor for charging the constant current from the first constant current source by using the reset voltage as an initial voltage; and
    a comparator for comparing an integral voltage of the integration capacitor with the analog voltage charged in the comparison voltage charging capacitor, and outputting a predetermined timing signal when the integral voltage exceeds the analog voltage.

2. The timing signal generator circuit as claimed in claim 1, wherein the digital-to-analog converter further comprises a third resistor inserted in series between the first resistor and the second resistor, the third resistor generating a base voltage that is a voltage between the reset voltage and the analog voltage, by a current of a sum of the first current and the second current.

3. The timing signal generator circuit as claimed in claim 2, wherein the current source circuit further comprises a first controller including a plurality of N second constant current sources each supplying a predetermined constant current, the first controller controlling the N second constant current sources to supply constant currents from "n" second constant current sources (where "n" corresponding to the input digital value) selected from the plurality of N second constant current sources to a first output terminal, and to supply remaining constant currents from (N−n) second constant current sources to a first connection terminal.

4. The timing signal generator circuit as claimed in claim 3, wherein the analog voltage-to-time converter further comprises a second controller for charging the integration capacitor with the reset voltage, charging the comparison voltage charging capacitor with the analog voltage, and thereafter, charging the integration capacitor with a constant current from the first constant current source.

5. The timing signal generator circuit as claimed in claim 4, wherein the comparator comprises an inverter including an input terminal connected to one end of the comparison voltage charging capacitor, the inverter having a threshold voltage that is a ground voltage, and
    wherein the second controller controls the integration capacitor, the comparison voltage charging capacitor, and the first constant current source to charge the integration capacitor with the reset voltage, to charge the comparison voltage charging capacitor with the analog voltage, to connect another end of the comparison voltage charging capacitor to the ground via the integration capacitor, and thereafter, to charge the integration capacitor with a constant current from the first constant current source.

6. The timing signal generator circuit as claimed in claim 2, wherein the analog voltage-to-time converter further comprises a second controller for charging the integration capacitor with the reset voltage, charging the comparison voltage charging capacitor with the analog voltage, and thereafter, charging the integration capacitor with a constant current from the first constant current source.

7. The timing signal generator circuit as claimed in claim 6, wherein the comparator comprises an inverter including an input terminal connected to one end of the comparison voltage charging capacitor, the inverter having a threshold voltage that is a ground voltage, and wherein the second controller controls the integration capacitor, the comparison voltage charging capacitor, and the first constant current source to charge the integration capacitor with the reset voltage, to charge the comparison voltage charging capacitor with the analog voltage, to connect another end of the comparison voltage charging capacitor to the ground via the integration capacitor, and thereafter, to charge the integration capacitor with a constant current from the first constant current source.

8. The timing signal generator circuit as claimed in claim 7, wherein the second controller controls the first constant current source to start up the first constant current source before a timing when the integration capacitor is charged with the constant current from the first constant current source.

9. The timing signal generator circuit as claimed in claim 6, wherein the second controller controls the first constant current source to start up the first constant current source before a timing when the integration capacitor is charged with the constant current from the first constant current source.

10. The timing signal generator circuit as claimed in claim 2, wherein the integration capacitor is a variable capacitor whose capacitance value can be changed.

11. The timing signal generator circuit as claimed in claim 1, wherein the current source circuit further comprises a first controller including a plurality of N second constant current sources each supplying a predetermined constant current, the first controller controlling the N second constant current sources to supply constant currents from "n" second constant current sources (where "n" corresponding to the input digital value) selected from the plurality of N second constant current sources to a first output terminal, and to supply remaining constant currents from (N–n) second constant current sources to a first connection terminal.

12. The timing signal generator circuit as claimed in claim 11, wherein the analog voltage-to-time converter further comprises a second controller for charging the integration capacitor with the reset voltage, charging the comparison voltage charging capacitor with the analog voltage, and thereafter, charging the integration capacitor with a constant current from the first constant current source.

13. The timing signal generator circuit as claimed in claim 12, wherein the comparator comprises an inverter including an input terminal connected to one end of the comparison voltage charging capacitor, the inverter having a threshold voltage that is a ground voltage, and wherein the second controller controls the integration capacitor, the comparison voltage charging capacitor, and the first constant current source to charge the integration capacitor with the reset voltage, to charge the comparison voltage charging capacitor with the analog voltage, to connect another end of the comparison voltage charging capacitor to the ground via the integration capacitor, and thereafter, to charge the integration capacitor with a constant current from the first constant current source.

14. The timing signal generator circuit as claimed in claim 11, wherein the integration capacitor is a variable capacitor whose capacitance value can be changed.

15. The timing signal generator circuit as claimed in claim 1, wherein the analog voltage-to-time converter further comprises a second controller for charging the integration capacitor with the reset voltage, charging the comparison voltage charging capacitor with the analog voltage, and thereafter, charging the integration capacitor with a constant current from the first constant current source.

16. The timing signal generator circuit as claimed in claim 15, wherein the comparator comprises an inverter including an input terminal connected to one end of the comparison voltage charging capacitor, the inverter having a threshold voltage that is a ground voltage, and wherein the second controller controls the integration capacitor, the comparison voltage charging capacitor, and the first constant current source to charge the integration capacitor with the reset voltage, to charge the comparison voltage charging capacitor with the analog voltage, to connect another end of the comparison voltage charging capacitor to the ground via the integration capacitor, and thereafter, to charge the integration capacitor with a constant current from the first constant current source.

17. The timing signal generator circuit as claimed in claim 16, wherein the second controller controls the first constant current source to start up the first constant current source before a timing when the integration capacitor is charged with the constant current from the first constant current source.

18. The timing signal generator circuit as claimed in claim 15, wherein the second controller controls the first constant current source to start up the first constant current source before a timing when the integration capacitor is charged with the constant current from the first constant current source.

19. The timing signal generator circuit as claimed in claim 15, wherein the integration capacitor is a variable capacitor whose capacitance value can be changed.

20. The timing signal generator circuit as claimed in claim 1, wherein the integration capacitor is a variable capacitor whose capacitance value can be changed.

* * * * *